United States Patent
Li et al.

(10) Patent No.: US 10,483,287 B1
(45) Date of Patent: Nov. 19, 2019

(54) DOUBLE GATE, FLEXIBLE THIN-FILM TRANSISTOR (TFT) COMPLEMENTARY METAL-OXIDE SEMICONDUCTOR (MOS) (CMOS) CIRCUITS AND RELATED FABRICATION METHODS

(71) Applicant: QUALCOMM Incorporated, San Diego, CA (US)

(72) Inventors: Xia Li, San Diego, CA (US); Bin Yang, San Diego, CA (US); Gengming Tao, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 16/138,084

(22) Filed: Sep. 21, 2018

(51) Int. Cl.
*H01L 27/12* (2006.01)
*H01L 29/786* (2006.01)
(Continued)

(52) U.S. Cl.
CPC .. *H01L 27/1225* (2013.01); *H01L 21/823864* (2013.01); *H01L 27/1262* (2013.01);
(Continued)

(58) Field of Classification Search
None
See application file for complete search history.

(56) References Cited

U.S. PATENT DOCUMENTS

| | | | |
|---|---|---|---|
| 6,261,881 B1 * | 7/2001 | Yamazaki | H01L 27/12 257/69 |
| 6,512,271 B1 * | 1/2003 | Yamazaki | H01L 29/66757 257/350 |

(Continued)

FOREIGN PATENT DOCUMENTS

CN 107611173 A 1/2018

OTHER PUBLICATIONS

Daus, A. et al., "Flexible CMOS electronics based on p-type $Ge_2Sb_2Te_5$ and n-type $InGaZnO_4$ semiconductors," 2017 IEEE International Electron Devices Meeting (IEDM), Dec. 2017, 8.1.1-8.1.4.
Münzenrieder Niko et al., "Flexible Self-Aligned Double-Gate IGZO TFT," IEEE Electron Device Letters, vol. 35, No. 1, Jan. 2014, pp. 69-71.

Primary Examiner — Michelle Mandala
(74) Attorney, Agent, or Firm — Withrow & Terranova, PLLC

(57) ABSTRACT

Transistors formed on semiconductor substrates are not well-suited for integrated circuits employed in media designed to structurally flex to conform to a shaped surface or in response to physical stress. Structural flexing of wearable electronic devices, such as clothing, may cause cracking in the semiconductor substrate, resulting in failure of the integrated circuits. TFTs formed on flexible substrates can withstand structural flexing without failure. CMOS circuits are employed due to cost, performance, and power efficiency considerations. To provide increased drive strength for such applications, a flexible TFT structure for a CMOS circuit disclosed herein includes an exemplary NFET integrated with a complementary PFET on a flexible substrate. By forming a top gate on a semiconductor layer of a FET opposite to a bottom gate formed between the semiconductor layer and the flexible substrate, an effective thickness of an inversion channel layer induced in the semiconductor layer is doubled.

15 Claims, 21 Drawing Sheets

(51) Int. Cl.
*H01L 29/10* (2006.01)
*H01L 21/8238* (2006.01)
*H01L 29/08* (2006.01)

(52) U.S. Cl.
CPC ...... *H01L 29/0847* (2013.01); *H01L 29/1033* (2013.01); *H01L 29/7869* (2013.01); *H01L 29/78645* (2013.01)

(56) References Cited

U.S. PATENT DOCUMENTS

| | | |
|---|---|---|
| 8,513,661 B2 | 8/2013 | Takahashi et al. |
| 9,390,981 B1* | 7/2016 | Basker ............ H01L 21/823814 |
| 9,721,811 B2 | 8/2017 | Yamazaki et al. |
| 9,929,279 B2 | 3/2018 | Yamazaki et al. |
| 10,211,109 B1* | 2/2019 | Leobandung ... H01L 21/823871 |
| 2002/0014628 A1* | 2/2002 | Koyama ................. G09G 3/30 257/72 |
| 2016/0211276 A1* | 7/2016 | Liu ...................... H01L 27/1211 |
| 2018/0166472 A1* | 6/2018 | Liang ................ G02F 1/136213 |

\* cited by examiner

US 10,483,287 B1

DOUBLE GATE, FLEXIBLE THIN-FILM TRANSISTOR (TFT) COMPLEMENTARY METAL-OXIDE SEMICONDUCTOR (MOS) (CMOS) CIRCUITS AND RELATED FABRICATION METHODS

BACKGROUND

I. Field of the Disclosure

The technology of the disclosure relates generally to integrated circuits (ICs) formed on a flexible substrate and, more specifically, to complementary metal-oxide semiconductor (MOS) (CMOS) ICs employing thin film transistors (TFTs).

II. Background

A high level of functional capability is made possible in electronic devices by transistors, which are employed in large numbers in integrated circuits (ICs) within electronic devices. Central processing units (CPUs) and memory systems are examples of components in electronic devices that employ a large quantity of transistors in ICs. Such components are typically formed in or on rigid substrates in semiconductor wafers split into dies that are packaged as IC chips. The IC chips are mounted to a printed circuit board (PCB). For example, in a personal computer or hand-held mobile device, an IC chip that has a semiconductor die with a rigid substrate can be structurally supported and protected by a device housing to prevent damage to the substrate. However, electronic devices are being developed for many new and different applications. One aspect of such new applications involves electronic devices integrated in various forms of media that do not provide structural protection for components of the electronic device. In one example, electronic devices are used in structurally flexible media, such as wearable devices that conform to the shape and movements of a user. The flexible media may be bent, folded, or twisted during normal use. In such applications, a housing containing semiconductor substrates would not be sufficiently conformable, and substrates without a housing could be stressed to the point of fracture, resulting in a failure of the electronic device. To address this issue, flexible thin-film transistor (TFT) devices have been developed that employ a flexible substrate for forming semiconductor devices as an alternative to a rigid substrate. TFT devices formed on a flexible substrate and integrated in electronic components of wearable devices can continue to operate without failure while flexing with the media.

SUMMARY OF THE DISCLOSURE

Aspects disclosed herein include double gate, flexible thin-film transistor (TFT) complementary metal-oxide semiconductor (MOS) (CMOS) circuits and related fabrication methods. For example, TFTs formed on flexible substrates are well suited to applications involving electronic devices incorporated into structurally flexible media, such as wearable devices, because the TFTs can withstand structural flexing that does not cause the electronic device to fail. In a flexible TFT CMOS circuit, a gate induces an inversion channel layer in a semiconductor material layer to provide a conduction channel. However, a thickness of the inversion channel layer induced by the gate in the semiconductor material layer may be only a small fraction of the thickness of the semiconductor material layer. The induced inversion channel may be so thin that the TFT device suffers from a high channel resistance, which leads to smaller drive current. In addition, the channel on/off control provided by the gate may be too weak to prevent high leakage current. Thus, in exemplary aspects disclosed herein, a double gate, flexible TFT CMOS circuit is provided that can have increased drive strength and channel control over TFTs. The TFT CMOS circuit includes an exemplary N-type thin-film Field-Effect Transistor (FET) (NFET) integrated with a P-type FET (PFET) on a flexible substrate. Each of the PFET and NFET includes a double gate structure to provide a respective double gate PFET and double gate NFET in the flexible TFT CMOS circuit. The double gate structure in each of the respective PFET and NFET includes a top gate on a top surface of a semiconductor material layer opposite to a bottom gate formed between a bottom surface of the semiconductor material layer and the flexible substrate. With the addition of the top gate to the bottom gate in the PFET and NFET, an effective thickness of an inversion channel layer induced in the semiconductor material layer may be at least doubled.

Increasing the inversion channel layer in this regard can significantly increase the maximum drive strength and channel on/off control of the PFET and NFET in the TFT CMOS circuit. In this regard, employing double gate FETs can improve performance and power efficiency. Thus, a double gate, flexible TFT CMOS circuit fabricated according to methods disclosed herein is suited for applications requiring electronic circuits that can endure structural flexing, such as bending and folding in a wearable device or other conformable media, and also provide increased performance and/or battery life.

In this regard, in one exemplary aspect, a complementary metal-oxide semiconductor (MOS) (CMOS) circuit is provided. The CMOS circuit comprises a flexible substrate, and at least one P-type Field-Effect Transistor (FET) (PFET) formed on a first surface of the flexible substrate. In the CMOS circuit, each of the at least one PFET comprises a first gate disposed on the first surface of the flexible substrate, and a P-type thin film semiconductor structure disposed over the first gate in a first axis direction. In the PFET of the CMOS circuit, the P-type thin film semiconductor structure comprises a first source/drain region, a second source/drain region, and a first channel region between the first and second source/drain regions. The PFET in the CMOS circuit further comprises a second gate disposed over the P-type thin film semiconductor structure in the first axis direction opposite to the first gate. The CMOS circuit further comprises at least one N-type FET (NFET) formed on the first surface of the flexible substrate. In the CMOS circuit, each of the at least one NFET comprises a third gate disposed on the first surface of the flexible substrate, and an N-type thin film semiconductor structure disposed over the third gate in the first axis direction. The N-type thin film semiconductor structure comprises a third source/drain region, a fourth source/drain region, and a second channel region between the third and fourth source/drain regions. The NFET in the CMOS circuit further comprises a fourth gate disposed over the N-type thin film semiconductor structure in the first axis direction opposite to the third gate. The CMOS circuit further comprises at least one metal contact electrically coupling the second source/drain region of the at least one PFET and the third source/drain region of the at least one NFET.

In another exemplary aspect, a method of fabricating a complementary metal-oxide semiconductor (MOS) (CMOS) circuit on a flexible substrate is provided. The method comprises forming a first gate and a second gate on a surface of a flexible substrate. The method also comprises forming a P-type semiconductor structure over the first gate in a first direction, and forming a N-type semiconductor structure over the second gate in the first direction. The method also comprises forming first and second PFET source/drain regions in first and second end portions, respectively, of the P-type semiconductor structure, and forming third and fourth NFET source/drain regions in first and second end portions, respectively, of the N-type semiconductor structure. The method also comprises forming a first metal contact on the second PFET source/drain region and a second metal contact on the third NFET source/drain region, electrically coupling the second PFET source/drain region and the third NFET source/drain region. The method also comprises forming a third gate over the P-type semiconductor structure opposite to the first gate in the first direction, and forming a fourth gate over the N-type semiconductor structure opposite to the second gate in the first direction.

BRIEF DESCRIPTION OF THE FIGURES

FIGS. 4A-1 to 4M illustrate exemplary stages of fabrication of the exemplary double gate flexible thin-film CMOS circuit shown in FIGS. 2A and 2B;

FIGS. 4A-1 and 4A-2 are a cross-sectional side view and top view, respectively of a first exemplary fabrication stage of the double gate flexible thin-film CMOS circuit of FIGS. 2A and 2B formed according to the exemplary process in FIG. 3;

FIGS. 4B-1 and 4B-2 are a cross-sectional side view and top view, respectively, of another exemplary fabrication stage of the exemplary double gate flexible thin-film CMOS circuit in FIGS. 2A and 2B in which a first photo-resist (PR) layer is disposed and patterned to form first and second bottom gates on a surface of the flexible substrate according to the exemplary process in FIG. 3;

FIGS. 4C-1 and 4C-2 are a cross-sectional side view and top view, respectively, of another exemplary fabrication stage of the exemplary double gate flexible thin-film CMOS circuit in FIGS. 2A and 2B in which the first PR layer is removed, and a first aluminum oxide dielectric layer is formed on the surface of the flexible substrate and on the bottom gates according to the exemplary process in FIG. 3;

FIGS. 4D-1 and 4D-2 are a cross-sectional side view and top view, respectively, of another exemplary fabrication stage of the exemplary double gate flexible thin-film CMOS circuit in FIGS. 2A and 2B in which a second PR layer is disposed and patterned to form an N-type semiconductor material layer over the first bottom gate according to the exemplary process in FIG. 3;

FIGS. 4E-1 and 4E-2 are a cross-sectional side view and top view, respectively, of another exemplary fabrication stage of the exemplary double gate flexible thin-film CMOS circuit in FIGS. 2A and 2B in which the second PR layer is removed, and a third PR layer is disposed and patterned to form a P-type semiconductor material layer over the second bottom gate according to the exemplary process in FIG. 3;

FIGS. 4F-1 and 4F-2 are a cross-sectional side view and top view, respectively, of another exemplary fabrication stage of the exemplary double gate flexible thin-film CMOS circuit in FIGS. 2A and 2B in which the third PR layer is removed according to the exemplary process in FIG. 3;

FIGS. 4G-1 and 4G-2 are a cross-sectional side view and top view, respectively, of another exemplary fabrication stage of the exemplary double gate flexible thin-film CMOS circuit in FIGS. 2A and 2B in which a fourth PR layer is disposed and patterned to form source/drain regions in end portions of the P-type semiconductor material layer and to form a metal contact on each of the source/drain regions of the PFET according to the exemplary process in FIG. 3;

FIGS. 4H-1 and 4H-2 are a cross-sectional side view and top view, respectively, of another exemplary fabrication stage of the exemplary double gate flexible thin-film CMOS circuit in FIGS. 2A and 2B in which the fourth PR layer is removed, and a fifth PR layer is disposed and patterned to form source/drain regions in end portions of the N-type semiconductor material layer and to form a metal contact on each of the source/drain regions of the NFET according to the exemplary process in FIG. 3;

FIGS. 4I-1 and 4I-2 illustrate a cross-sectional side view and top view, respectively, of another exemplary fabrication stage of the exemplary double gate flexible thin-film CMOS circuit in FIGS. 2A and 2B in which the fifth PR layer is removed, and a second aluminum oxide dielectric layer is formed on the N-type and P-type semiconductor material layers, and the metal contacts, according to the exemplary process in FIG. 3;

FIGS. 4J-1 and 4J-2 are a top and cross-sectional side view, respectively, of another exemplary fabrication stage of the exemplary double gate flexible thin-film CMOS circuit in FIGS. 2A and 2B in which side spacers are formed on vertical surfaces of the second aluminum oxide dielectric layer in top gate regions of the N-type and P-type semiconductor layers according to the exemplary process in FIG. 3;

FIGS. 4K-1 and 4K-2 are a top and cross-sectional side view, respectively, of another exemplary fabrication stage of the exemplary double gate flexible thin-film CMOS circuit in FIGS. 2A and 2B in which a sixth PR layer is disposed and patterned to form top gates in the top gate regions of the N-type and P-type semiconductor layers according to the exemplary process in FIG. 3;

FIGS. 4L-1 and 4L-2 are a top and cross-sectional side view, respectively, of another exemplary fabrication stage of the exemplary double gate flexible thin-film CMOS circuit in FIGS. 2A and 2B in which the sixth PR layer is removed according to the exemplary process in FIG. 3;

FIG. 4M is a cross-sectional side view of a thirteenth exemplary fabrication stage of the exemplary double gate flexible thin-film CMOS circuit in FIGS. 2A and 2B in which, by employing a seventh PR layer (not shown), portions of the second aluminum oxide dielectric layer are removed, source/drain electrodes are formed on the metal contacts on the source/drain regions, and top gate electrodes are formed on the top gates according to the exemplary process in FIG. 3;

FIG. 5-1 is a cross-sectional side view of an exemplary double gate flexible thin-film CMOS circuit in which source/drain regions are formed on a top surface of a bottom gate;

FIG. 5-2 is a cross-sectional side view of an exemplary fabrication stage of the exemplary double gate flexible thin-film CMOS circuit in FIG. 5-1, corresponding to the fabrication stage in FIG. 4D-1, in which a second PR layer is disposed and patterned to form an N-type semiconductor material layer on a top surface of a first bottom gate;

FIG. 5-3 is a cross-sectional side view of an exemplary fabrication stage of the exemplary double gate flexible thin-film CMOS circuit in FIG. 5-1, corresponding to the fabrication stage in FIG. 4E-1, in which the second PR layer is removed, and a third PR layer is disposed and patterned to form a P-type semiconductor material layer on a top surface of a second bottom gate;

FIG. 5-4 is a cross-sectional side view of an exemplary fabrication stage of the exemplary double gate flexible thin-film CMOS circuit in FIG. 5-1, corresponding to the fabrication stage in FIG. 4F-1, in which the third PR layer is removed;

DETAILED DESCRIPTION

Figure 1:
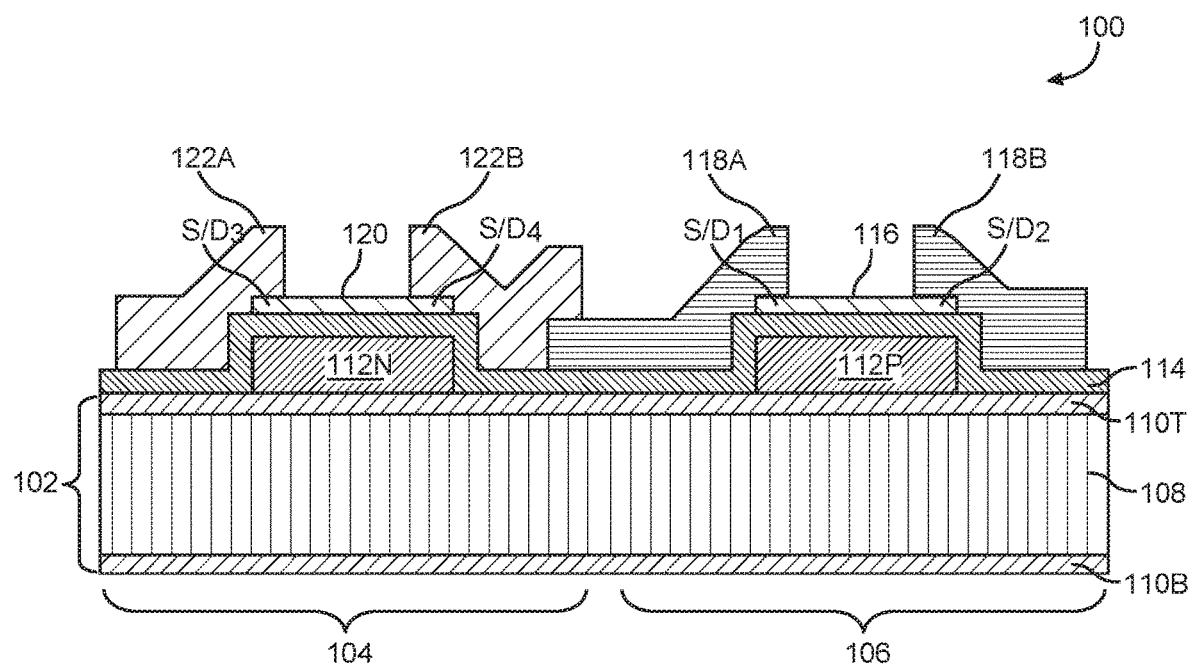
FIG. 1 is a side cross-sectional view of an N-type metal-oxide semiconductor (MOS) thin-film transistor (TFT) and a P-type MOS TFT on a flexible substrate.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include double gate, flexible thin-film transistor (TFT) complementary metal-oxide semiconductor (MOS) (CMOS) circuits and related fabrication methods. For example, TFTs formed on flexible substrates are well suited to applications involving electronic devices incorporated into structurally flexible media, such as wearable devices, because the TFTs can withstand structural flexing that does not cause the electronic device to fail. In a flexible TFT CMOS circuit, a gate induces an inversion channel layer in a semiconductor material layer to provide a conduction channel. However, a thickness of the inversion channel layer induced by the gate in the semiconductor material layer may be only a small fraction of the thickness of the semiconductor material layer. The induced inversion channel may be so thin that the TFT device suffers from a high channel resistance, which leads to smaller drive current. In addition, the channel on/off control provided by the gate may be too weak to prevent high leakage current. Thus, in exemplary aspects disclosed herein, a double gate, flexible TFT CMOS circuit is provided that can have increased drive strength and channel control over TFTs. The TFT CMOS circuit includes an exemplary N-type thin-film Field-Effect Transistor (FET) (NFET) integrated with a P-type FET (PFET) on a flexible substrate. Each of the PFET and NFET includes a double gate structure to provide a respective double gate PFET and double gate NFET in the flexible TFT CMOS circuit. The double gate structure in each of the respective PFET and NFET includes a top gate on a top surface of a semiconductor material layer opposite to a bottom gate formed between a bottom surface of the semiconductor material layer and the flexible substrate. With the addition of the top gate to the bottom gate in the PFET and NFET, an effective thickness of an inversion channel layer induced in the semiconductor material layer may be at least doubled.

Increasing the inversion channel layer in this regard can significantly increase the maximum drive strength and channel on/off control of the PFET and NFET in the TFT CMOS circuit. In this regard, employing double gate FETs can improve performance and power efficiency. Thus, a double gate, flexible TFT CMOS circuit fabricated according to methods disclosed herein is suited for applications requiring electronic circuits that can endure structural flexing, such as bending and folding in a wearable device or other conformable media, and also provide increased performance and/or battery life.

Figure 2A:
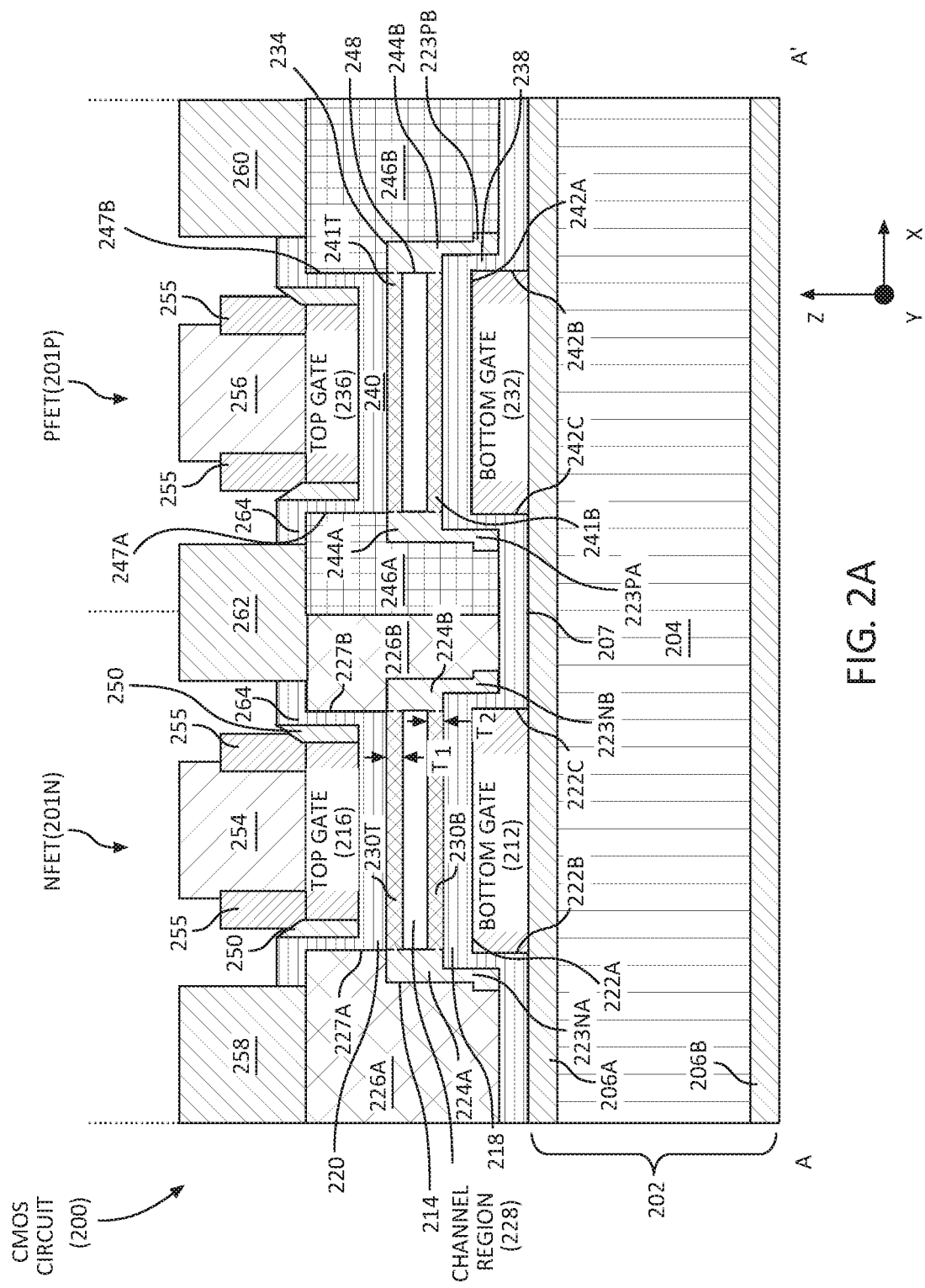
FIG. 2A is a cross-sectional side view of an exemplary complementary MOS (CMOS) circuit employing a double gate, thin-film N-type Field-Effect Transistor (FET) (NFET) integrated with a double gate thin-film P-type FET (PFET) on a flexible substrate ("double gate flexible thin-film CMOS circuit") in which source/drain regions are formed on side surfaces of a bottom gate.
Figure 2B:
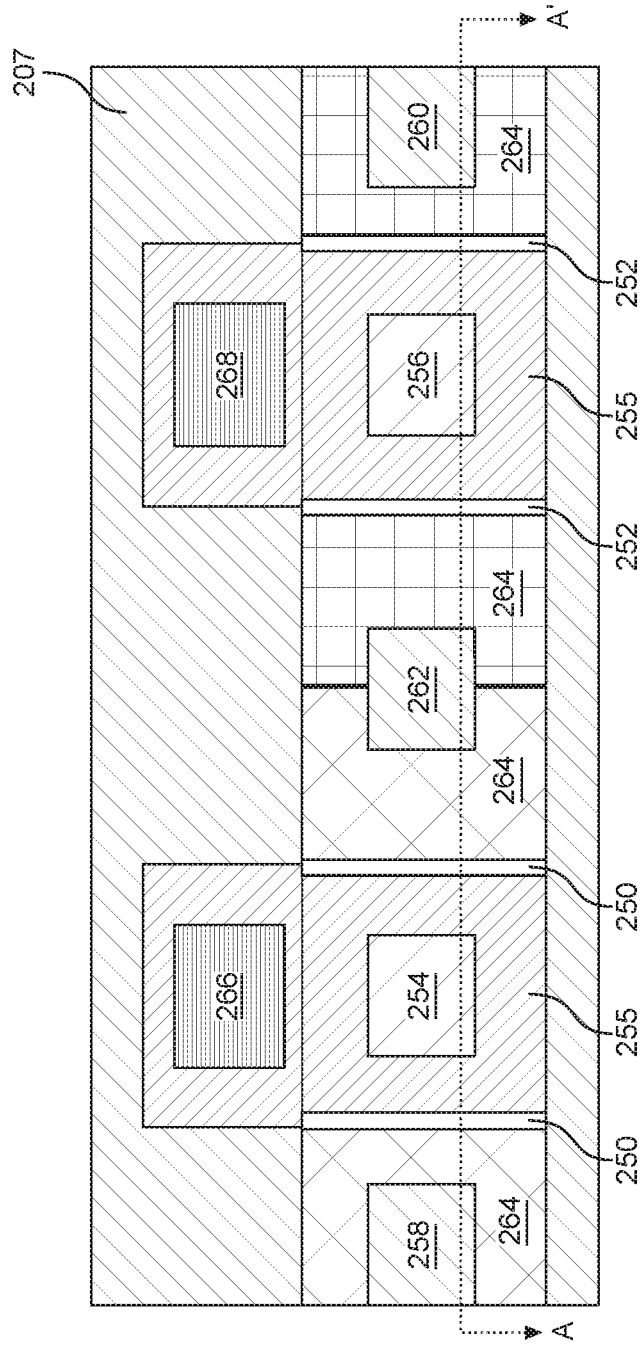
FIG. 2B is a top view of the exemplary double gate flexible thin-film CMOS circuit shown in FIG. 2A.

FIGS. 2A and 2B discussed below illustrate exemplary CMOS circuits employing a double gate, thin-film NFET integrated with a double gate thin-film PFET on a flexible substrate ("double gate flexible thin-film CMOS circuit"). Before discussing the exemplary double gate flexible thin-film CMOS circuit in FIGS. 2A and 2B, an exemplary CMOS circuit on a flexible thin-film substrate in FIG. 1 is first described.

In this regard, FIG. 1 illustrates a CMOS circuit 100 including a flexible substrate 102 having an NFET 104 and a PFET 106 disposed thereon. The CMOS circuit 100 is in the form of a CMOS inverter configuration. The term CMOS refers to a circuit design that uses complementary pairs of NFETs and PFETs, such as NFET 104 and PFET 106, for providing logic functions. The NFET 104 and the PFET 106 are electrically insulated from the flexible substrate material 108 by a top insulating layer 110T. In particular, the top insulating layer 110T (e.g., an oxide material) prevents electrical shorts between a gate 112N (e.g., a metal gate) of the NFET 104 and a gate 112P of the PFET 106 through the flexible substrate 102. Note that the term "metal oxide" in "CMOS" does not mean that a CMOS circuit, including the CMOS circuit 100 in FIG. 1 is limited to use of a metal gate electrode placed on top of an oxide insulator. For example, gate materials can include a polysilicon material.

With continuing reference to FIG. 1, the flexible substrate 102 in the CMOS circuit 100 also includes a bottom insulating layer 110B to electrically insulate the flexible substrate 102 from external connections. A gate insulating layer 114 is formed over the gates 112N and 112P. The PFET 106 includes a film of P-type semiconductor material 116 having a typical thickness of 50-100 nanometers (nm) disposed on the gate insulating layer 114 above a top surface of the gate 112P. Source/drain regions $S/D_1$ and $S/D_2$ are formed in respective end portions of the film of P-type semiconductor material 116, and PFET source/drain contacts 118A and 118B are disposed on the source/drain regions $S/D_1$ and $S/D_2$, respectively. The NFET 104 includes a film of N-type semiconductor material 120 having a typical thickness of 50-100 nm disposed on the gate insulating layer 114 above a top surface of the gate 112N. Drain/source regions $S/D_3$ and $S/D_4$ are formed in respective end portions of the film of N-type semiconductor material 120, and NFET drain/source contacts 122A and 122B are disposed on the drain/source regions $S/D_3$ and $S/D_4$, respectively. A portion of the NFET drain/source contact 122B is also disposed on the PFET source/drain contact 118A, to electrically connect the source/drain region $S/D_1$ of the PFET 106 to the drain/source region $S/D_4$ of the NFET 104.

The gates 112N and 112P of the respective NFET 104 and PFET 106 are only capable of inducing a thin inversion channel layer (approximately 10-20 nm) in the film of P-type semiconductor material 116 and the film of N-type semiconductor material 120, respectively. Thus, approximately 30-90 nm of the active thickness of the film of P-type semiconductor material 116 and the film of N-type semiconductor material 120 do not contribute to the conduction channels. This causes the PFET 106 and the NFET 104 to have a high channel resistance, which leads to a weaker drive current. In addition, a weak channel on/off control provided by the gates 112P and 112N allows a high leakage current in the CMOS circuit 100, causing increased power consumption.

Thus, to provide a CMOS circuit that can include a flexible substrate with a lower channel resistance and higher drive current, with reduced leakage, an exemplary double gate flexible thin-film CMOS circuit 200 in FIGS. 2A and 2B is provided. The double gate flexible thin-film CMOS circuit 200 in FIGS. 2A and 2B may also be referred to herein as "CMOS circuit 200." FIG. 2A is a cross-sectional side view of the double gate flexible thin-film CMOS circuit 200 employing a double gate, thin-film NFET 201N integrated with a double gate thin-film PFET 201P on a flexible substrate 202. FIG. 2B is a top view of the double gate flexible thin-film CMOS circuit 200 shown in FIG. 2A. The cross-sectional side view in FIG. 2A is taken at line A-A' in FIG. 2B. The CMOS circuit 200 is formed on the flexible substrate 202. The flexible substrate 202 is formed of a flexible material 204 having a thickness of about 10-500 micrometers (μm), such as a flexible polyimide substrate having a thickness of approximately 50 μm as an example. The flexible substrate 202 bends in a range from 0 to 90 degrees, for example. The flexible substrate 202 includes a top insulating layer 206A and a bottom insulating layer 206B, which may be formed of Silicon Nitride (SiN) or oxide as examples, to electrically insulate the flexible material 204 of the flexible substrate 202 from elements of the CMOS circuit 200 formed thereon and from external contact. The CMOS circuit 200 includes the NFET 201N integrated with the PFET 201P on the flexible substrate 202.

With continuing reference to FIGS. 2A and 2B, the NFET 201N includes a bottom gate 212 disposed on a first surface 207 of the flexible substrate 202, an N-type semiconductor structure 214 disposed over the bottom gate 212 in the Z-axis direction, and a top gate 216. The top gate 216 is disposed over the N-type semiconductor structure 214 opposite to the bottom gate 212 in the Z-axis direction. The top gate 216 may be coupled to the bottom gate 212. In some examples, the top gate 216 may be directly coupled to the bottom gate 212. The N-type semiconductor structure 214 may have a thickness of 50-100 μm for example. The N-type semiconductor structure 214 is insulated from the bottom gate 212 by a gate dielectric 218, and the N-type semiconductor structure 214 is insulated from the top gate 216 by a gate dielectric 220 extending between the N-type semiconductor structure 214 and a bottom surface of the top gate 216. The gate dielectrics 218 and 220 may be oxides, such as an aluminum oxide (e.g., $Al_2O_3$). The gate dielectric 218 is formed on a top surface 222A of the bottom gate 212, on side surfaces 222B and 222C of the bottom gate 212, and on the first surface 207 of the flexible substrate 202 adjacent to the bottom gate 212. The N-type semiconductor structure 214 is formed on the gate dielectric 218 over the top surface 222A of the bottom gate 212. End portions 223NA and 223NB of the N-type semiconductor structure 214 extend around the side surfaces 222B and 222C and are disposed adjacent to the side surfaces 222B and 222C of the bottom gate 212. Source/drain regions 224A and 224B are formed in the end portions 223NA and 223NB of the N-type semiconductor structure 214. Metal contacts 226A and 226B are formed on the source/drain regions 224A and 224B, respectively.

With continuing reference to the double gate flexible thin-film CMOS circuit 200 in FIGS. 2A and 2B, the NFET 201N includes a channel region 228 of the N-type semiconductor structure 214 that extends between the source/drain regions 224A and 224B. The bottom gate 212 and the top gate 216 are each configured to induce inversion channel layers in the channel region 228. Since the bottom gate 212 is directly coupled to the top gate 216 in this example, the bottom gate 212 induces an inversion channel layer 230B in a bottom surface of the channel region 228, and the top gate 216 induces an inversion channel layer 230T in a top surface of the channel region 228. In this manner, with the top gate 216 and the bottom gate 212 in the NFET 201N, a total effective area of a conduction channel in the CMOS circuit 200 is approximately at least twice the effective area of a conduction channel in the CMOS circuit 100 of FIG. 1. A thickness $T_1$ of the induced inversion channel layer 230T combined with a thickness $T_2$ of the induced inversion channel layer 230B is approximately 40-50 nm in this example, which is approximately at least twice the thickness of an inversion channel layer induced by only the bottom gate 212. Increased effective area of a conduction channel provided by the coupled bottom gate 212 and top gate 216 increases drive strength in the NFET 201N for increased performance, and increases a channel on/off control strength, to reduce leakage current and save power.

With continuing reference to FIGS. 2A and 2B, the PFET 201P in the double gate flexible thin-film CMOS circuit 200 includes a bottom gate 232 disposed on the first surface 207 of the flexible substrate 202, a P-type semiconductor structure 234 disposed over the bottom gate 232 in the Z-axis direction, and a top gate 236. The top gate 236 is disposed over the P-type semiconductor structure 234 opposite to the bottom gate 232 in the Z-axis direction. The top gate 236 may be coupled to the bottom gate 232. In some examples, the top gate 236 may be directly coupled to the bottom gate 232. The P-type semiconductor structure 234 is insulated from the bottom gate 232 by a gate dielectric 238, and the P-type semiconductor structure 234 is insulated from the top gate 236 by a gate dielectric 240 extending between the P-type semiconductor structure 234 and a bottom surface of the top gate 236. The bottom gate 232 and the top gate 236 induce inversion channel layers 241B and 241T, respectively, in the bottom and top surfaces of the P-type semiconductor structure 234. The gate dielectrics 238 and 240 may be oxides, such as an aluminum oxide (e.g., $Al_2O_3$) for example. The gate dielectric 238 is formed on a top surface 242A of the bottom gate 232, on side surfaces 242B and 242C of the bottom gate 232, and on the first surface 207 of the flexible substrate 202 adjacent to the bottom gate 232. The gate dielectric 238 of the PFET 201P may be formed with the gate dielectric 218 of the NFET 201N. The P-type semiconductor structure 234 is formed on the gate dielectric 238 over the top surface 242A of the bottom gate 232. End portions 223PA and 223PB of the P-type semiconductor structure 234 extend around the side surfaces 242B and 242C of the bottom gate 232 and are disposed adjacent to the side surfaces 242B and 242C of the bottom gate 232. Source/drain regions 244A and 244B are formed in the end portions 223PA and 223PB of the P-type semiconductor structure 234. Metal contacts 246A and 246B are formed on the source/drain regions 244A and 244B, respectively.

With continuing reference to FIGS. 2A and 2B, the metal contacts 226A and 226B disposed on the source/drain regions 224A and 224B include top surfaces that are farther in the Z-axis direction from the first surface 207 of the flexible substrate 202 than a bottom surface of the top gate 216. The gate dielectric layer 220 and side spacers 250 are between side surfaces 227A and 227B of the metal contacts 226A and 226B and respective adjacent side surfaces of the top gate 216. The side spacers 250 each have opposing side surfaces and a top surface. The top surface of each side spacer 250 has a portion of the top gate 216 formed thereon. Similarly, the metal contacts 246A and 246B disposed on the source/drain regions 244A and 244B include top surfaces that are farther in the Z-axis direction from the first surface 207 of the flexible substrate 202 than a bottom surface of the top gate 236. The gate dielectric layer 240 and side spacers 252 are between side surfaces 247A and 247B of the metal contacts 246A and 246B and respective adjacent side surfaces of the top gate 236. The side spacers 252 each have opposing side surfaces and a top surface. The top surface of each side spacer 252 has a portion of the top gate 236 formed thereon.

To electrically couple to elements of the CMOS circuit 200, electrodes are provided. Top gate electrodes 254 and 256 are disposed on the top gate 216 and the top gate 236, respectively. A top surface of the top gates 216 and 236 may extend farther from the first surface 207 at edge portions 255 than at a center region. Thus, the edge portions 255 of the top gates 216 and 236 may extend in the Z-axis direction on side surfaces of the top gate electrodes 254 and 256 for improved electrical coupling. Source/drain electrodes 258 and 260 are disposed on the metal contacts 226A and 246B, respectively. The metal contact 226B and the metal contact 246A are adjacent and electrically coupled with each other to electrically couple the NFET 20 N and the PFET 201P. A single source/drain electrode 262 is disposed on top surfaces of the coupled metal contacts 226B and 246A. An insulator layer 264 is disposed on top surfaces of the metal contacts 226A, 226B, 246A, and 246B in portions of the top surfaces that are not covered by the source/drain electrodes 258, 260, and 262. With reference to FIG. 2B, a bottom gate electrode 266 is disposed on the bottom gate 212, and a bottom gate electrode 268 is disposed on the bottom gate 232. In the CMOS circuit 200, the bottom gate 212 is coupled to the top gate 216, and the bottom gate 232 is coupled to the top gate 236. In addition, a signal input of the CMOS circuit 200 may be coupled to both of the bottom gate electrodes 266 and 268, for example, to connect the bottom and top gates 212 and 216 of the NFET 201N to the bottom and top gates 232 and 236 of the PFET 201P, but other connections are possible. A signal output of the CMOS circuit 200 may be coupled to the single source/drain electrode 262, for example, but other connections are possible.

Figure 3:
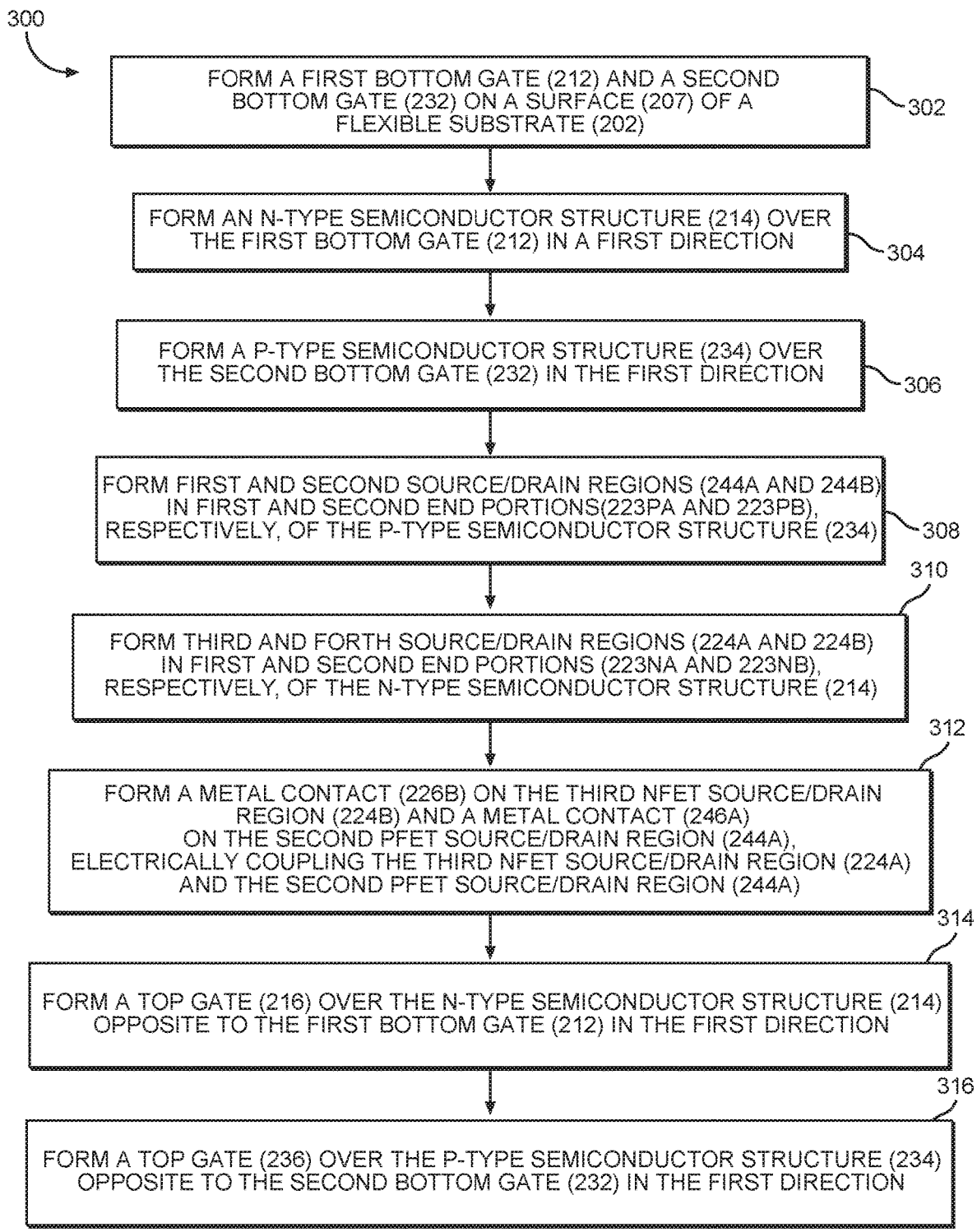
FIG. 3 is a flowchart illustrating an exemplary process for fabricating the double gate flexible thin-film CMOS circuit as shown in FIGS. 2A and 2B.

Integration of the double gate NFET 201N with the double gate PFET 201P on the flexible substrate 202 provides increased drive current and improved channel control. In addition, the disclosed process simplifies fabrication, which reduces cost, while improving device miniaturization efforts. For example, manufacturing an integrated NFET 201N and PFET 201P reduces duplication of fabrication stages in comparison to fabricating an NFET and a PFET in separate processes. The integrated fabrication process forms common features of the NFET 201N and the PFET 201P together in a single step or set of steps. The integration of features reduces both the physical area of the CMOS circuit 200 and the need for one or more upper-level interconnects (i.e., metal traces), formed in subsequent processes, for coupling complementary FETs in a CMOS circuit. In this regard, FIG. 3 is a flowchart that illustrates an exemplary process 300 for fabricating the integrated NFET 20 N and the PFET 201P in the exemplary CMOS circuit 200 in FIGS. 2A and 2B. Aspects of the process 300 in FIG. 3 are discussed in detail in conjunction with exemplary fabrication states 400(A)-400(M) illustrated in FIGS. 4A-1 and 4A-2 through 4M.

Figures 1, 4A:
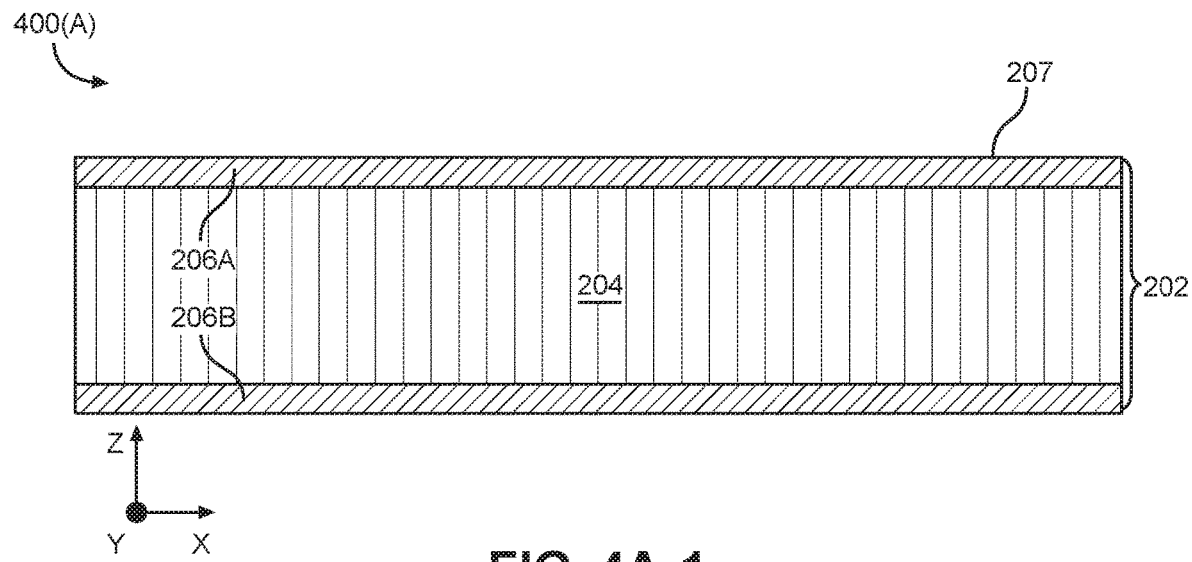
Figures 2, 4A:
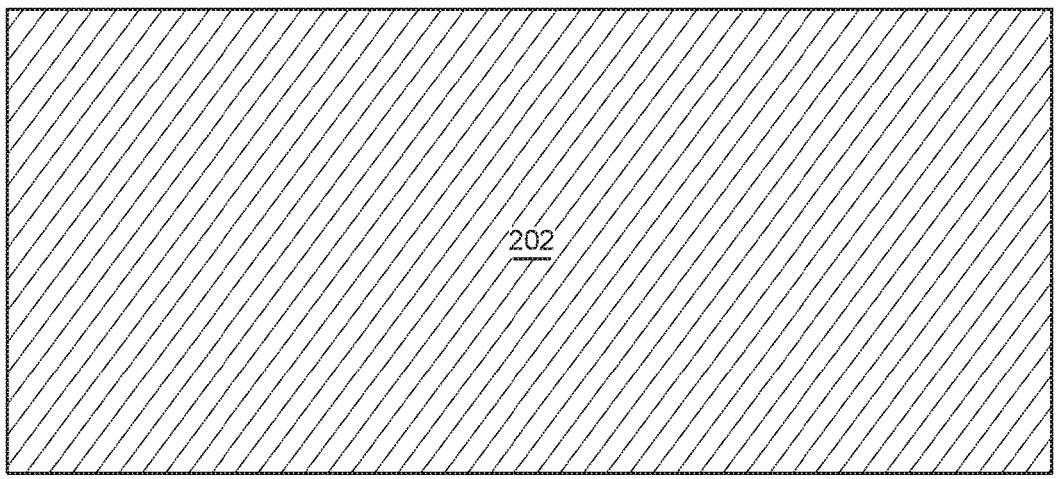

In this regard, FIG. 4A-1 illustrates a cross-sectional view in a first exemplary fabrication stage 400(A) in which the top insulating layer 206A and the bottom insulating 206B are formed on both sides (i.e., top and bottom surfaces) of the flexible substrate 202 that is formed of the flexible material 204. The flexible substrate 202 may be a flexible polyimide, plastic, or glass substrate as non-limiting examples. The flexibility of the flexible substrate 202 and the thin-film NFET 201N and PFET 201P allows the resulting CMOS circuit 200 to be conformable for applications such as clothing, as discussed above. The top insulating layer 206A and the bottom insulating layer 206B may be formed of SiN or an oxide by, for example, low temperature chemical vapor deposition (CVD) or another process. FIG. 4A-2 illustrates a top view of the first surface 207 of the flexible substrate 202.

Figures 1, 4B:
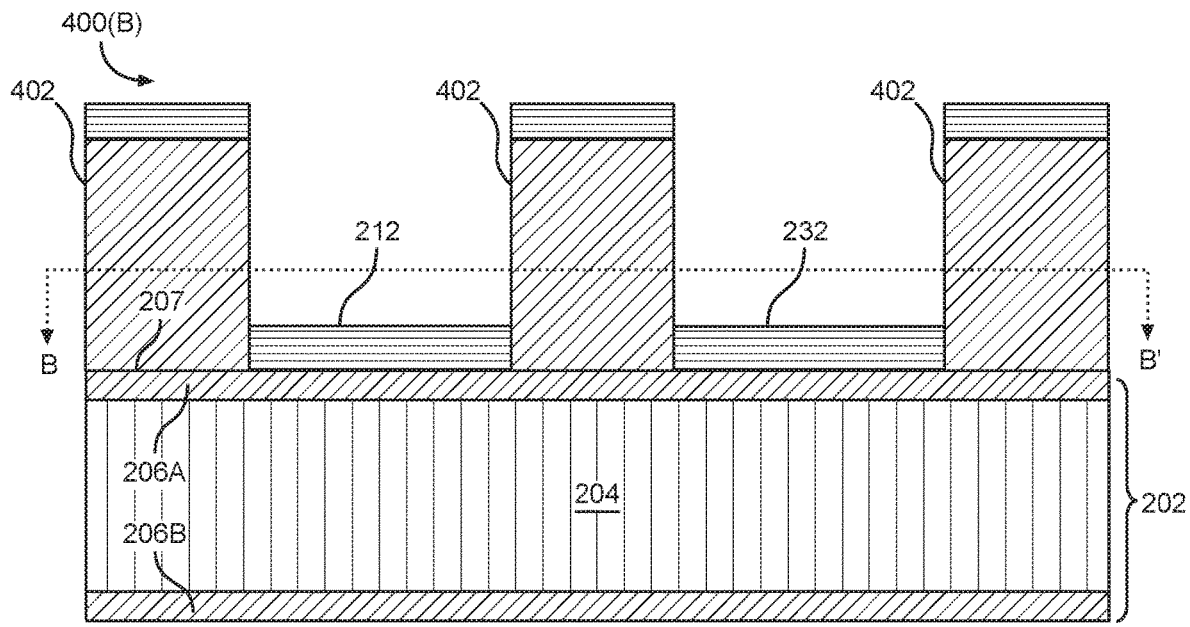
Figures 2, 4B:
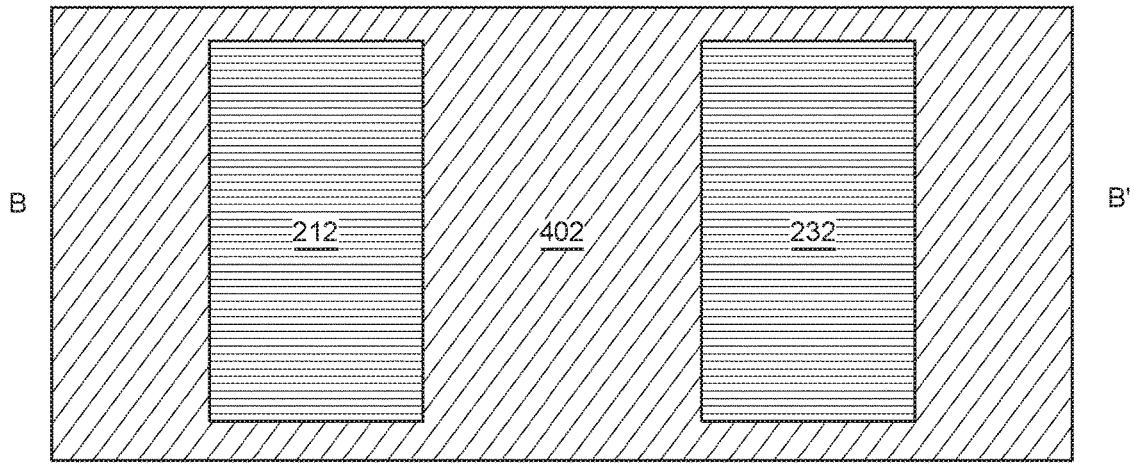

FIG. 4B-1 illustrates a cross-sectional side view in another exemplary fabrication stage 400(B) in which the first bottom gate 212 of the NFET 201N and the second bottom gate 232 of the PFET 201P are formed on the first surface 207 of the flexible substrate 202 (block 302). FIG. 4B-1 is a cross-sectional side view of the flexible substrate 202 on which the bottom gates 212 and 232 are formed. The bottom gates 212 and 232 are first gates of a double gate structure for controlling current in each of the respective double gate FETs 201N and 201P. A photo-resist (PR) layer 402 is disposed on the first surface 207. The PR layer 402 is patterned to have openings where the bottom gates 212 and 232 are to be formed. The bottom gates 212 and 232 may both be formed by a process in which evaporated metal (e.g., Ti/Au/Ti) is deposited over the PR layer 402 and on the first surface 207 in the openings in the PR layer 402. The metal deposited in the openings in the PR layer 402 form the bottom gates 212 and 232. FIG. 4B-2 illustrates a top view of the structure in FIG. 4B-1 taken at cross-section B-B' illustrating the PR layer 402 and the bottom gates 212 and 232. Metal deposited on the PR layer 402 is removed when the PR layer 402 is lifted (e.g., washed away) using a PR solvent. In places where the PR layer 402 is removed, the first surface 207 is exposed, leaving the bottom gates 212 and 232 on the first surface 207.

Figures 1, 4C:
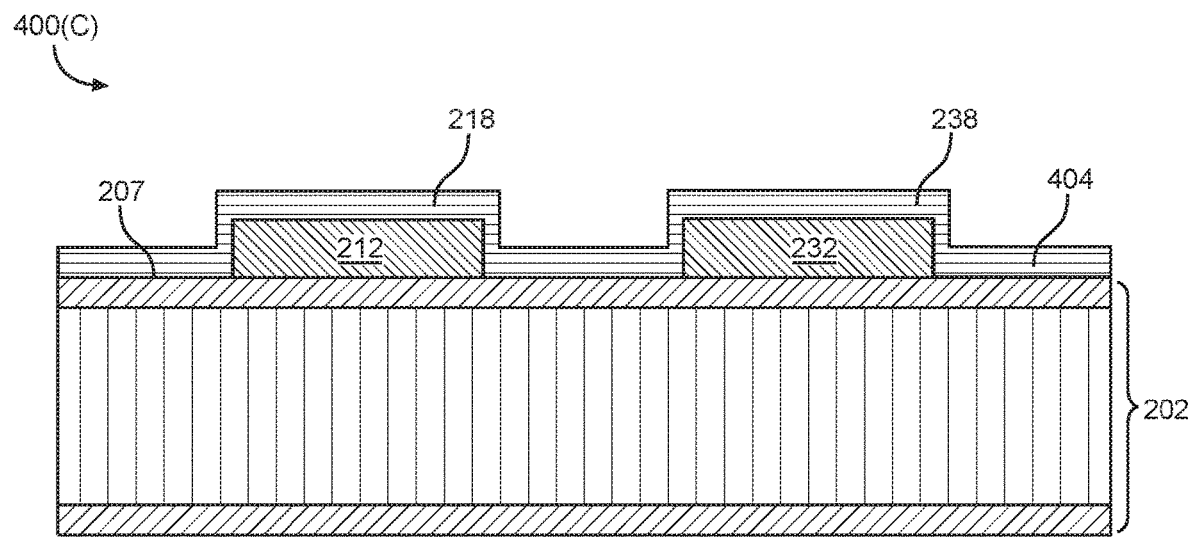
Figures 2, 4C:
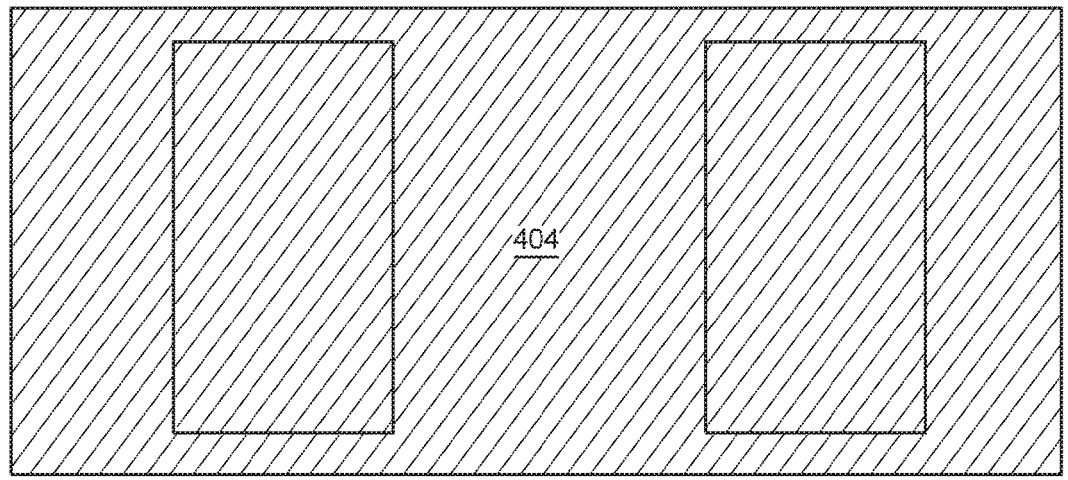

FIGS. 4C-1 and 4C-2 illustrate a cross-sectional side view and a top view, respectively, in another exemplary fabrication stage 400(C). In fabrication stage 400(C), the gate dielectric 218 of the NFET 201N and the gate dielectric 238 of the PFET 201P are both formed as part of an oxide layer 404 disposed over the bottom gates 212 and 232. The oxide layer 404 may be aluminum oxide ($Al_2O_3$), for example, or another oxide material that is deposited by a low temperature (e.g., 150° C.) atomic layer deposition (ALD) process. Other methods of oxide deposition are possible. In this regard, the oxide layer 404 is disposed on the first surface 207, on the top and side surfaces 222A, 222B, and 222C of the first bottom gate 212, and on the top and side surfaces 242A, 242B, and 242C of the second bottom gate 232. The oxide layer 404 provides a dielectric layer between the bottom gate 212 and the N-type semiconductor structure 214 in which the inversion channel layer 230B is induced by a voltage in the bottom gate 212. The oxide layer 404 also provides a dielectric layer between the bottom gate 232 and the P-type semiconductor structure 234 in which the inversion channel layer 241B is induced by a voltage in the bottom gate 232.

Figures 1, 4D:
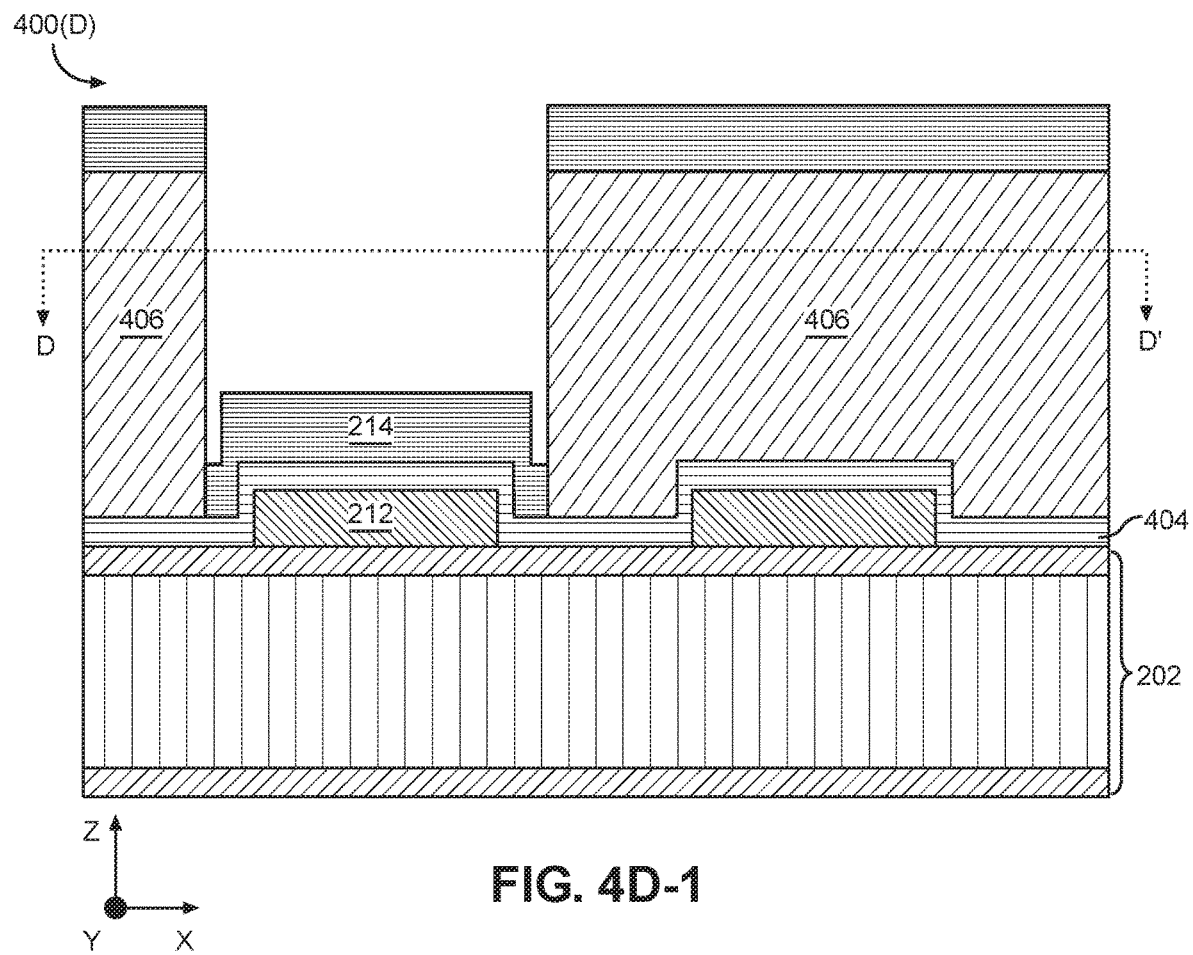
Figures 2, 4D:
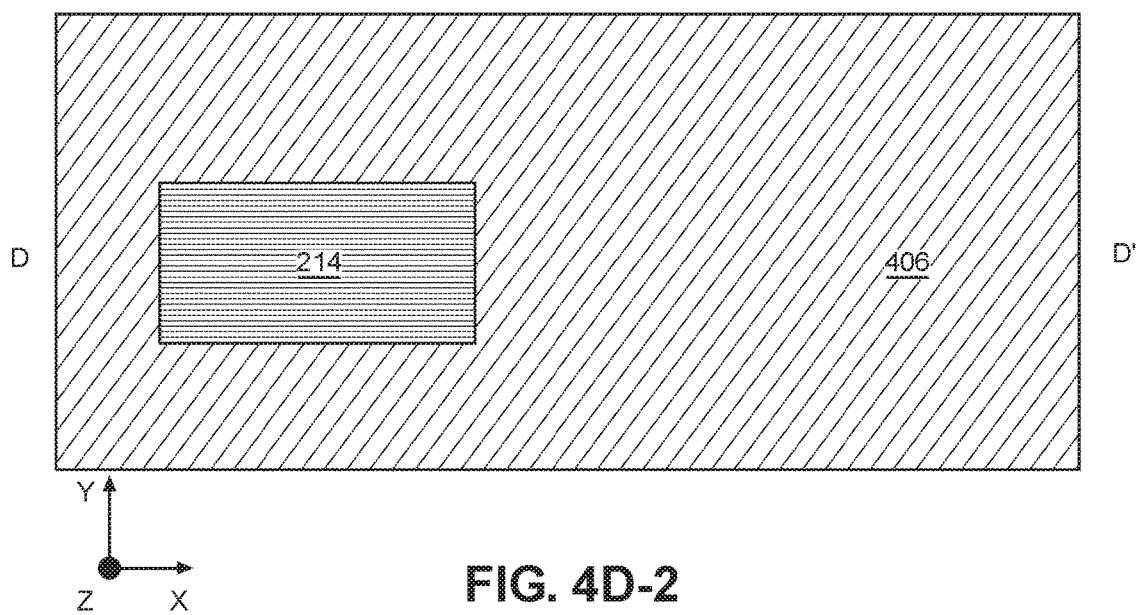

FIG. 4D-1 illustrates a cross-sectional side view in another exemplary fabrication stage 400(D) in which the N-type semiconductor structure 214 is formed over (i.e., in the Z-axis direction) the first bottom gate 212 in a first direction (block 304). The NFET 201N and the PFET 201P in the CMOS circuit 200 are distinguished from each other by their respective semiconductor types. Thus, in the fabrication process, the N-type semiconductor structure 214 is formed in fabrication stage 400(D), which is separate from a corresponding fabrication stage 400(E) for forming the P-type semiconductor structure 234. Although the fabrication stage 400(D) is described first, the CMOS circuit 200 may be obtained by performing the fabrication stage 400(E) before fabrication stage 400(D). In this regard, a PR layer 406 is disposed over the oxide layer 404 and patterned with an opening corresponding to the N-type semiconductor structure 214. A radio frequency (RF) magnetron sputtering process, for example, may be employed to deposit an NMOS channel material (e.g., InGaZnO$_4$) to form the N-type semiconductor structure 214. In this example, the NMOS channel material is formed over the oxide layer 404 disposed on the top and side surfaces 222A, 222B, and 222C of the first bottom gate 212. FIG. 4D-2 illustrates a top view of the structure taken at cross-section D-D' in FIG. 4D-1 of the PR layer 406 employed for formation of the N-type semiconductor structure 214 in fabrication stage 400(D).

Figures 1, 4E:
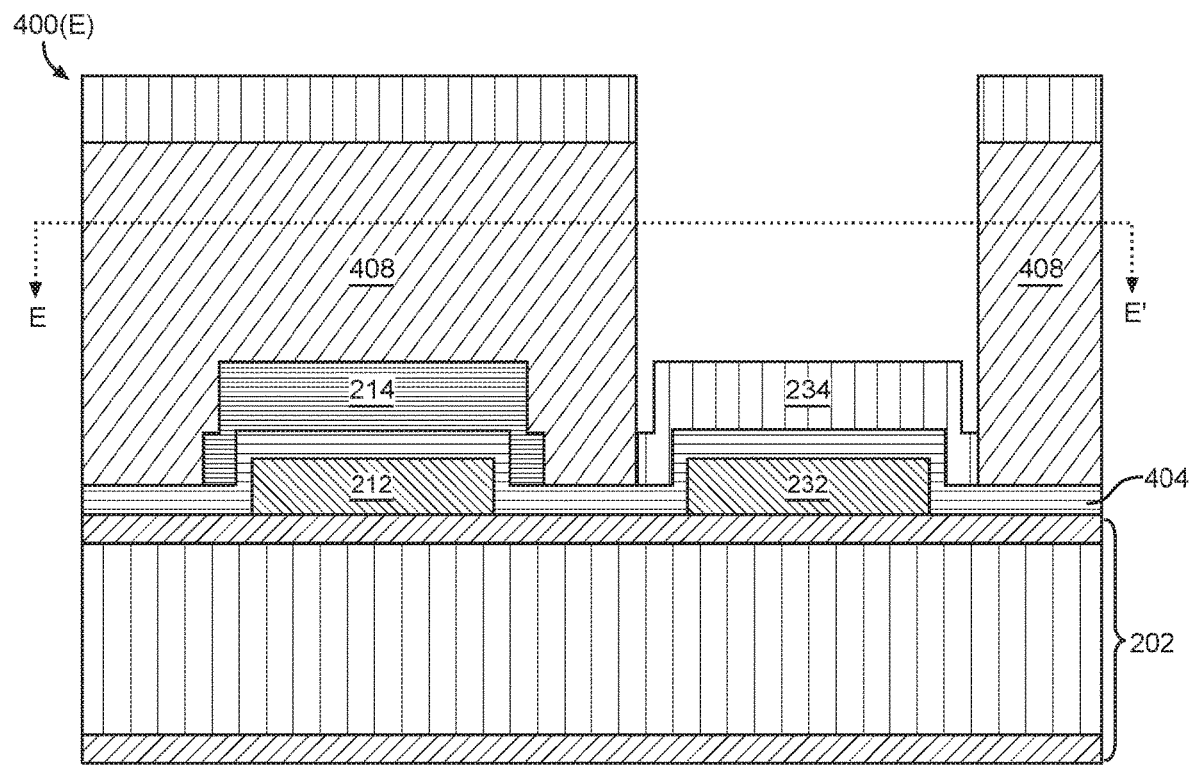
Figures 2, 4E:
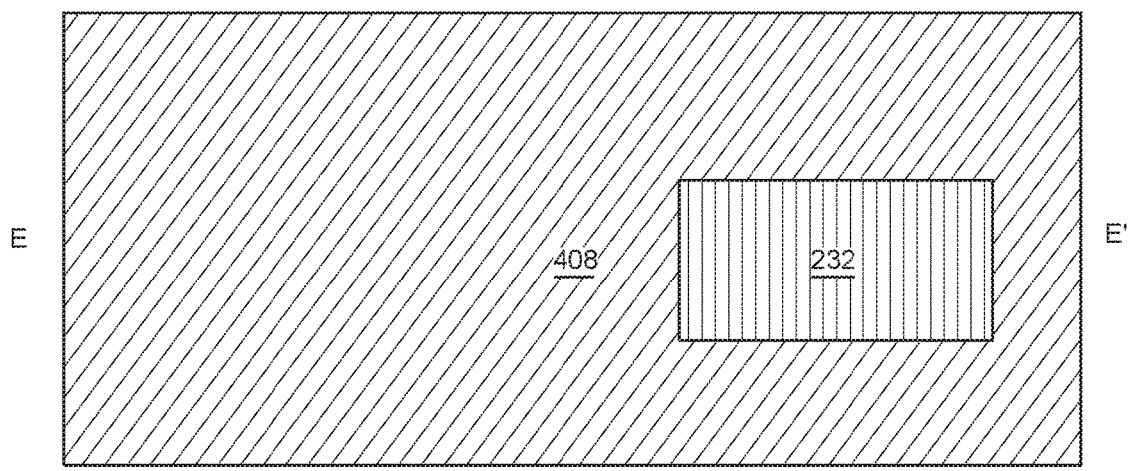

FIG. 4E-1 illustrates a cross-sectional side view in another exemplary fabrication stage 400(E) in which the P-type semiconductor structure 234 is formed over (i.e., in the Z-axis direction) the second bottom gate 232 in the first direction (block 306). With the PR layer 406 lifted, a PR layer 408 is disposed over the N-type semiconductor structure 214, and also over the oxide layer 404, and the PR layer 408 is patterned to form an opening over the second bottom gate 232 above which the P-type semiconductor structure 234 is to be formed. A direct current (DC) magnetron sputtering process, for example, may be employed to deposit a PMOS channel material (e.g., Ge$_2$Sb$_2$Te$_5$) to form the P-type semiconductor structure 234. The PMOS channel material is formed over the oxide layer 404 disposed on the top and side surfaces 242A, 242B, and 242C of the second bottom gate 232. FIG. 4E-2 is a top view of the structure in FIG. 4E-1 taken at cross-section E-E' of the PR layer 408 employed for formation of the P-type semiconductor structure 234 in fabrication stage 400(E). The N-type semiconductor structure 214 and the P-type semiconductor structure 234 enable the NFET 201N and the PFET 201P to provide the complementary characteristics of the CMOS circuit 200.

Figures 1, 4F:
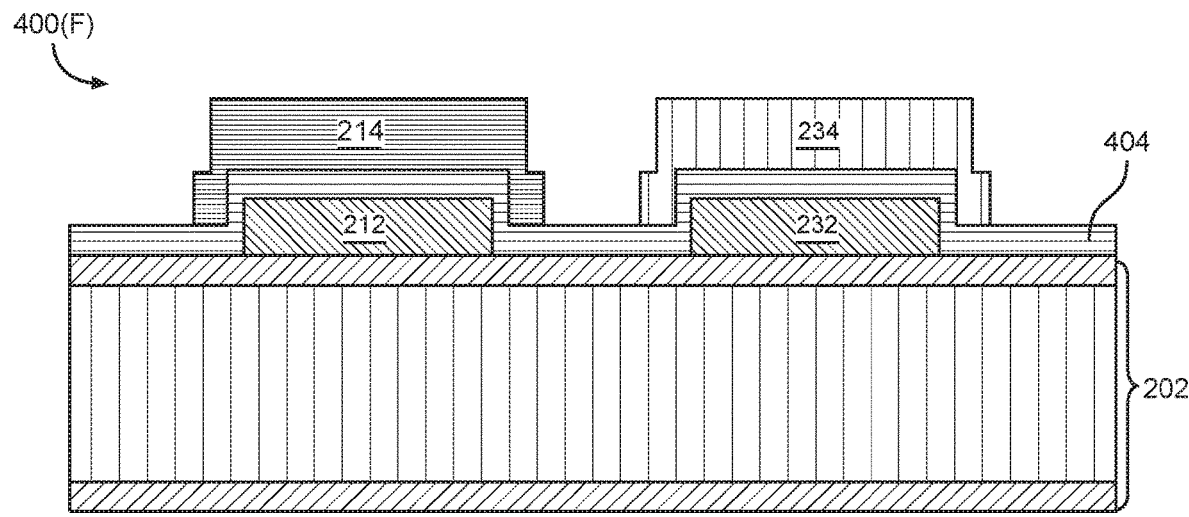
Figures 2, 4F:
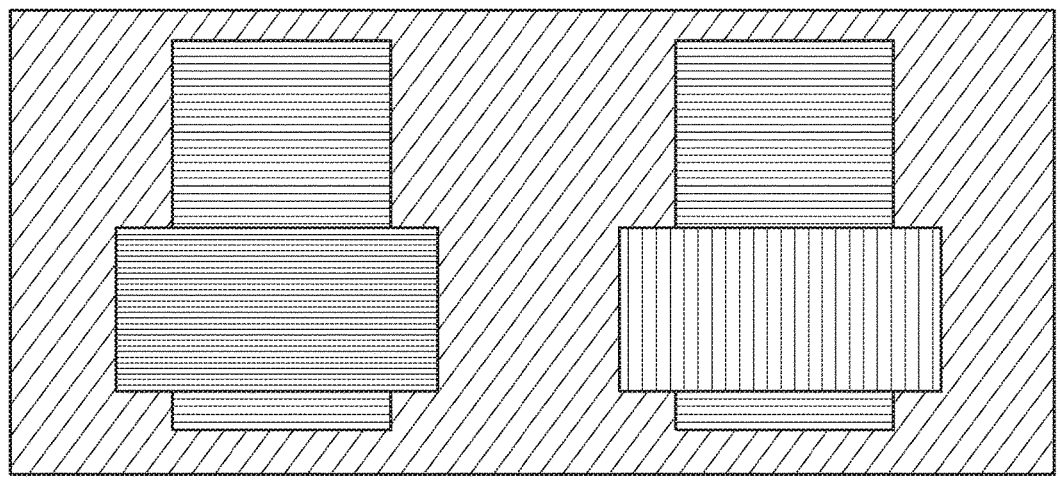

FIG. 4F-1 illustrates another fabrication stage 400(F) in which the PR layer 408 is lifted from the structure in FIGS. 4E-1 and 4E-2. FIG. 4F-1 is a cross-sectional side view of the N-type semiconductor structure 214 formed on the oxide layer 404 over the bottom gate 212, and the P-type semiconductor structure 234 formed on the oxide layer 404 over the bottom gate 232. As noted above, the same structure may be obtained by performing the fabrication stage 400(E) before the fabrication stage 400(D). FIG. 4F-2 illustrates a top view of the layout of the N-type semiconductor structure 214 and the P-type semiconductor structure 234, and the bottom gates 212 and 232. Although portions of the bottom gates 212 and 232 not covered by the N-type semiconductor structure 214 and the P-type semiconductor structure 234 are visible in FIG. 4F-2 for purposes of illustration, those portions are still covered by the oxide layer 404 deposited at fabrication stage 400(C).

Figures 1, 4G:
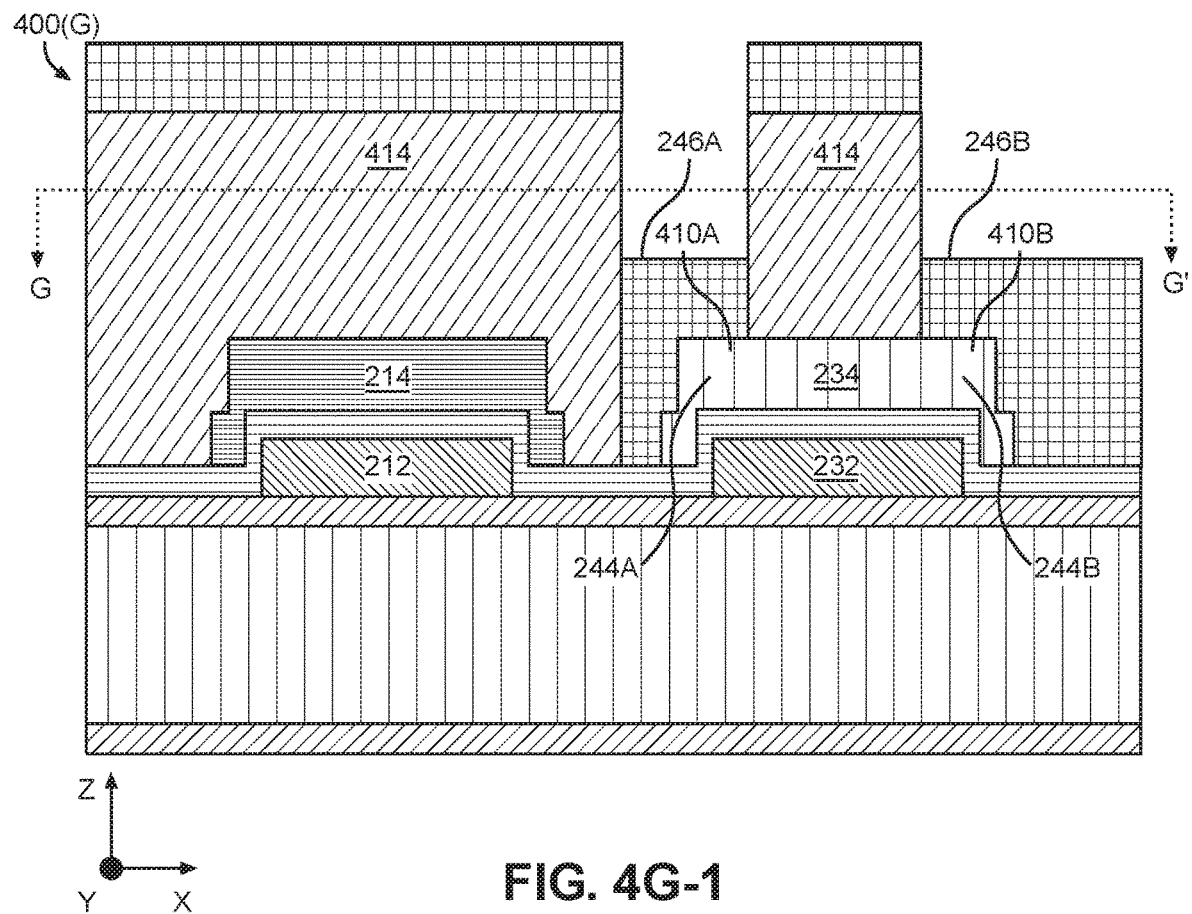
Figures 2, 4G:
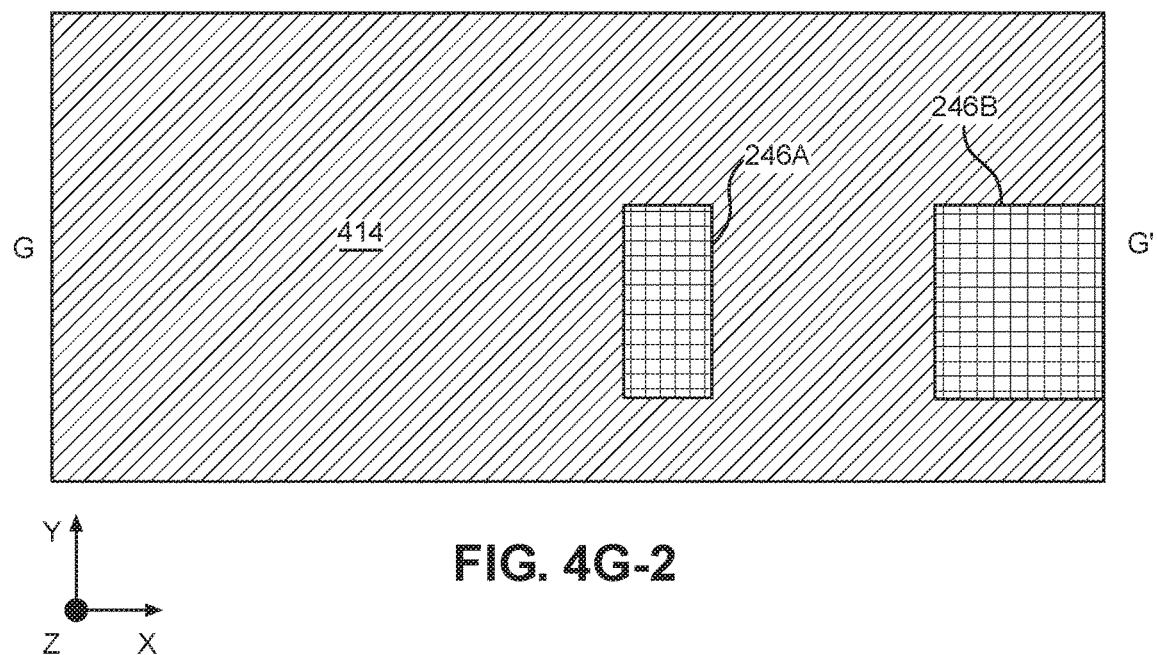

FIG. 4G-1 illustrates a cross-sectional side view in another exemplary fabrication stage 400(G) in which the source/drain regions 244A and 244B are formed in the end portions 223PA and 223PB, respectively, of the P-type semiconductor material structure 234 (block 308). In this regard, a PR layer 414 is formed over the structure in FIGS. 4F-1 and 4F-2 and patterned to expose the end portions 223PA and 223PB of the P-type semiconductor material structure 234. The source/drain regions 244A and 244B are formed in the exposed end portions 223PA and 223PB, respectively. For example, the source/drain regions 244A and 244B may be formed in the P-type semiconductor structure 234 by a doping process or by an epitaxial growth. The channel region 248 of the P-type semiconductor structure 234 extends between the source/drain region 244A and the source/drain region 244B. The direction of current in the channel region 248 is determined by a voltage potential between the source/drain regions 244A and 244B. Metal contacts 246A and 246B are formed on each of the exposed source/drain regions 244A and 244B to provide electrical coupling to the source/drain regions 244A and 244B in the CMOS circuit 200. In this regard, an evaporated metal deposition process, for example, is employed to deposit the metal contacts 246A and 246B (e.g., Ge/Ni/Au) on the source/drain regions 244A and 244B, respectively. FIG. 4G-2 illustrates a top view of the structure in FIG. 4G-1 taken at cross-section G-G' of the PR layer 414 employed for formation of the source/drain regions 244A and 244B, and the metal contacts 246A and 246B.

Figures 1, 4H:
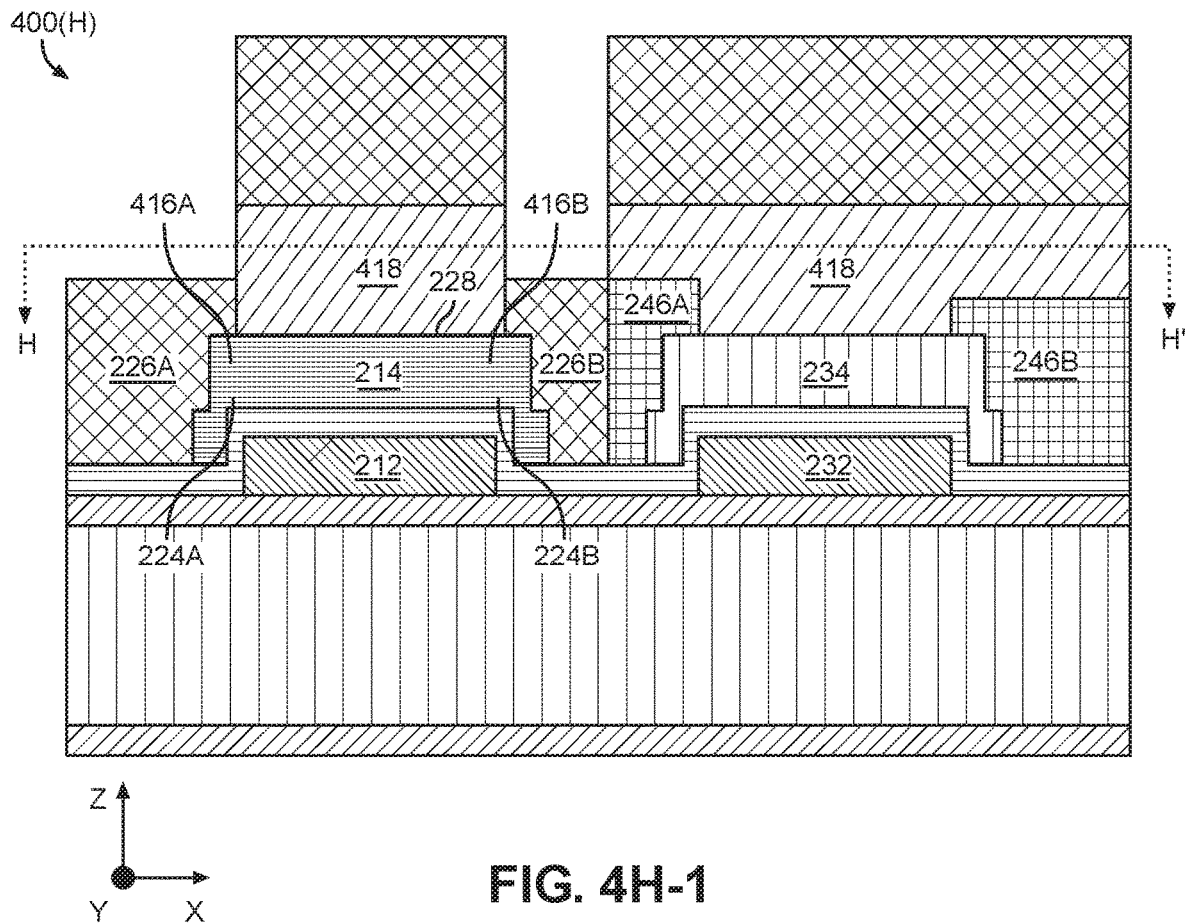
Figures 2, 4H:
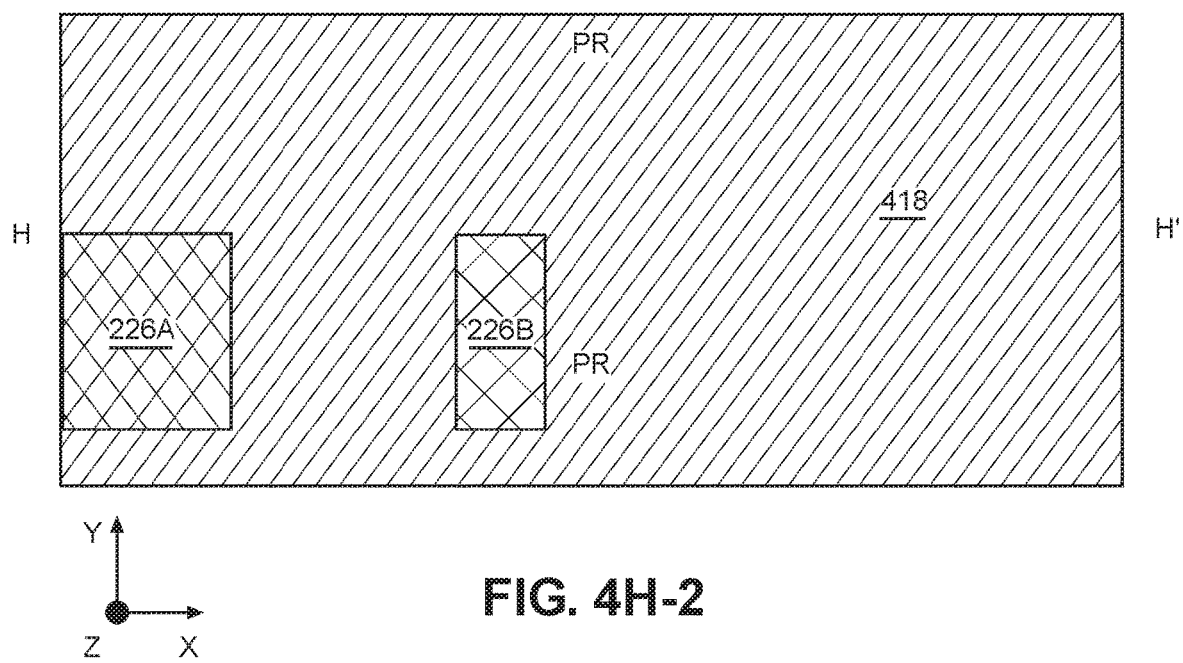

FIG. 4H-1 illustrates a cross-sectional side view in another exemplary fabrication stage 400(H) in which the source/drain regions 224A and 224B are formed in the end portions 223NA and 223NB, respectively, of the N-type semiconductor structure 214 (block 310). In this regard, with the PR layer 414 employed in fabrication stage 400(G) lifted, a PR layer 418 is deposited and patterned to expose the end portions 223NA and 223NB of the N-type semiconductor material structure 214. The source/drain regions 224A and 224B are formed in the exposed end portions 223NA and 223NB, respectively, by a process of doping the N-type semiconductor structure 214, or by epitaxial growth, for example. The channel region 228 of the N-type semiconductor structure 214 extends between the source/drain region 224A and the source/drain region 224B. The direction of current in the channel region 228 is determined by a voltage potential between the source/drain regions 224A and 224B. In addition, the metal contacts 226A and 226B are formed on the exposed source/drain regions 224A and 224B. An evaporated metal deposition process, for example, is employed to deposit the metal contacts 226A and 226B (e.g., Ti/Au) on the source/drain regions 224A and 224B, respectively. With the metal contact 226B on the third NFET source/drain region 224B and the metal contact 246A on the second PFET source/drain region 244A, the metal contact 226B is deposited adjacent to metal contact 246A, electrically coupling the third NFET source/drain region 224A and the second PFET source/drain region 244A (block 312). FIG. 4H-2 illustrates a top view of the structure in FIG. 4H-1 taken at cross-section H-H' to illustrate the PR layer 418 patterned for formation of the source/drain regions 224A and 224B, and the metal contacts 226A and 226B. As with the fabrication stages 400(D) and 400(E), the order of fabrication stages 400(G) and 400(H) is optional, as long as fabrication stage 400(G) is performed after fabrication stage 400(F) in which the P-type semiconductor structure 234 is formed, and fabrication stage 400(H) is performed after fabrication stage 400(E) in which the N-type semiconductor structure 214 is formed. Subsequent fabrication stages 400(I)-400(M) are directed to structures further integrating the NFET 201N and the PFET 201P.

Figures 1, 4I:
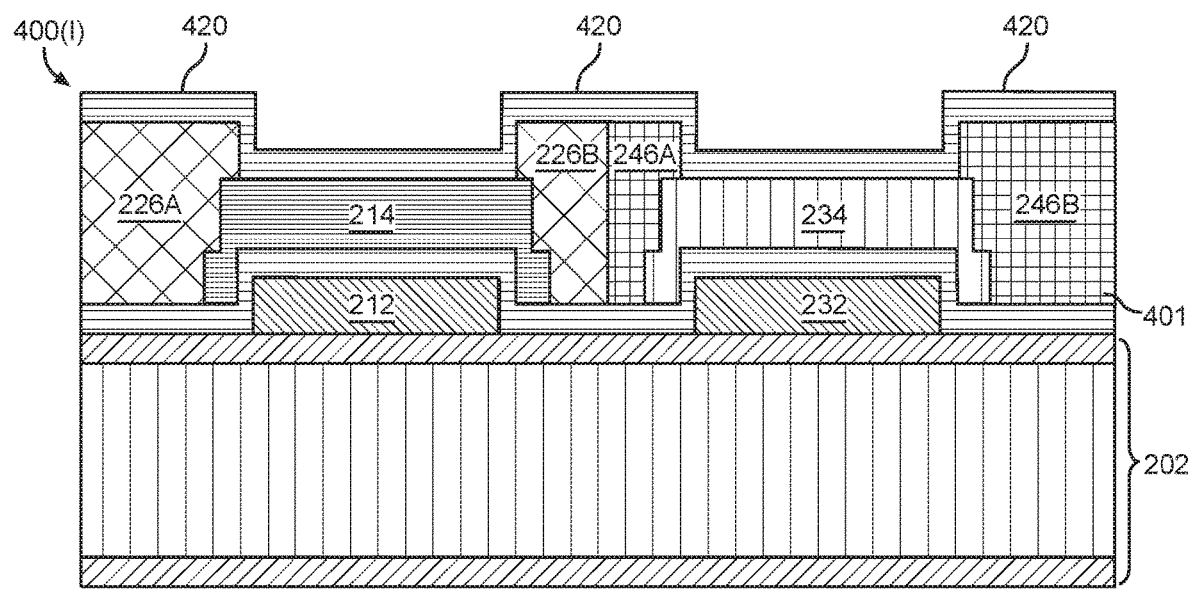
Figures 2, 4I:
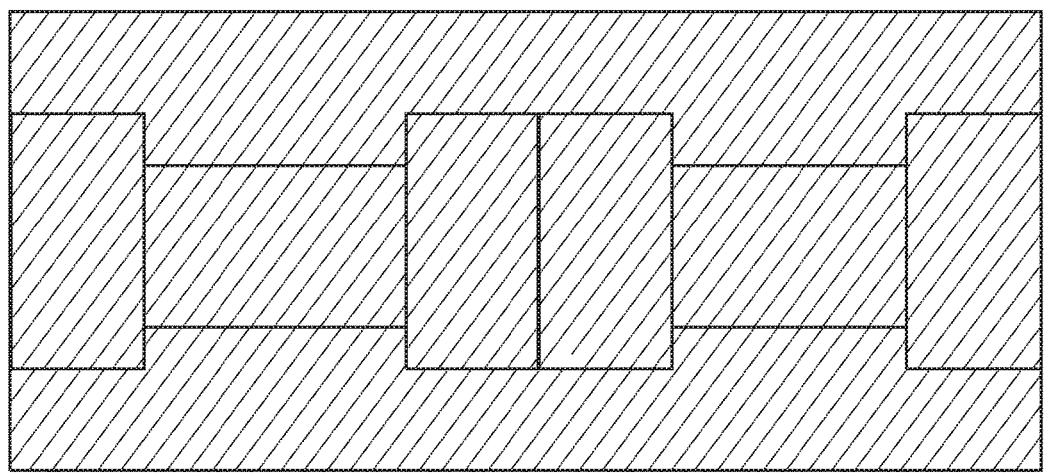

FIGS. 4I-1 and 4I-2 illustrate a cross-sectional side view and a top view, respectively, in another exemplary fabrication stage 400(I) in which the PR layer 418 is lifted from the structure in FIGS. 4H-1 and 4H-2, and an oxide layer 420 is disposed on the metal contacts 226A, 226B, 246A, and 246B, and on the N-type semiconductor structure 214 and the P-type semiconductor structure 234. The oxide layer 420 forms the get dielectric 220 between the N-type semiconductor structure 214 and the top gate 216 of the NFET 201N. In the integrated CMOS circuit 200, the oxide layer 420 also forms the gate dielectric 240 between the P-type semiconductor structure 234 and the top gate 236 of the PFET 201P. The oxide layer 420 may be, for example, aluminum oxide (e.g., $Al_2O_3$) deposited by a low temperature ALD process. However, other oxides may be used and other deposition processes are possible.

Figures 1, 4J:
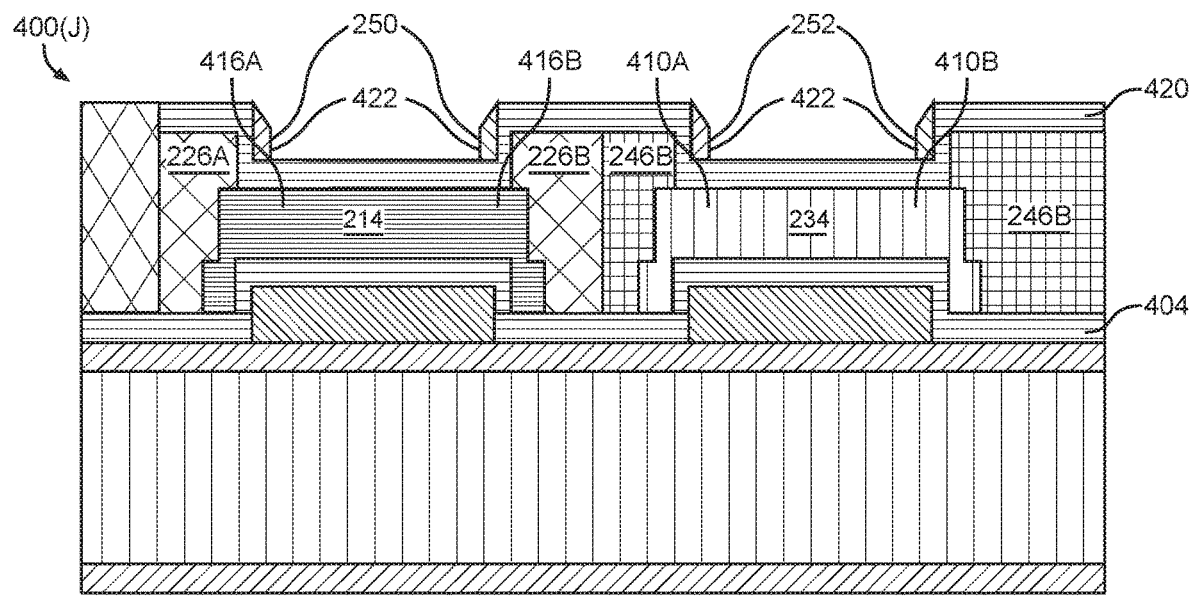
Figures 2, 4J:
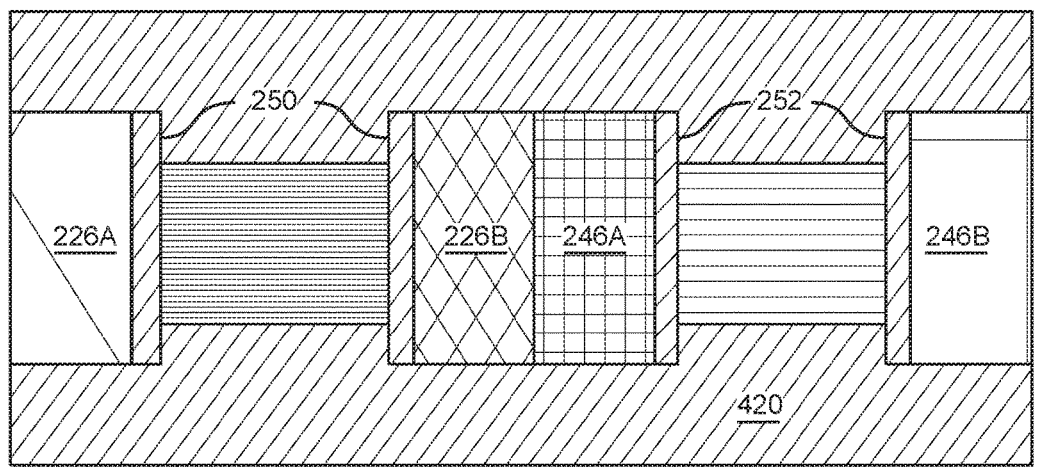

FIGS. 4J-1 and 4J-2 illustrate a cross-sectional side view and a top view, respectively, in another exemplary fabrication stage 400(J) in which the side spacers 250 and 252 are formed for the NFET 201N and the PFET 201P. The side spacers 250 and 252 are formed over the oxide layer 420 on vertical surfaces (i.e., surfaces that extend in the Z-axis direction) of the metal contacts 226A, 226B, 246A, and 246B. In fabrication stage 400(J), a spacer film 422 is disposed on the oxide 420. The spacer film 422 may be formed of a SiN film, for example, disposed by a low temperature deposition process. Portions of the spacer film 422 are then removed (e.g., etched back) from horizontal surfaces (i.e., surfaces extending in the X-axis and Y-axis directions), but the spacer film 422 is not removed from the vertical surfaces of the metal contacts 226A, 226B, 246A, and 246B. Thus, the spacer film 422 remaining on vertical surfaces of the metal contacts 226A and 226B above the end portions 223NA and 223NB of the N-type semiconductor structure 214 forms the side spacers 250, and the spacer film 422 remaining on vertical surfaces of the metal contacts 246A and 246B above the end portions 223PA and 223PB of the P-type semiconductor structure 234 forms the side spacers 252. The side spacers 250 and 252 increase insulation between the top gates 216 and 236 and adjacent contact metals to which source/drain voltage levels are applied. In addition, the side spacers 250 and 252 improve centering of the top gates 216 and 236 over the respective semiconductor structures 214 and 234.

Figures 1, 4K:
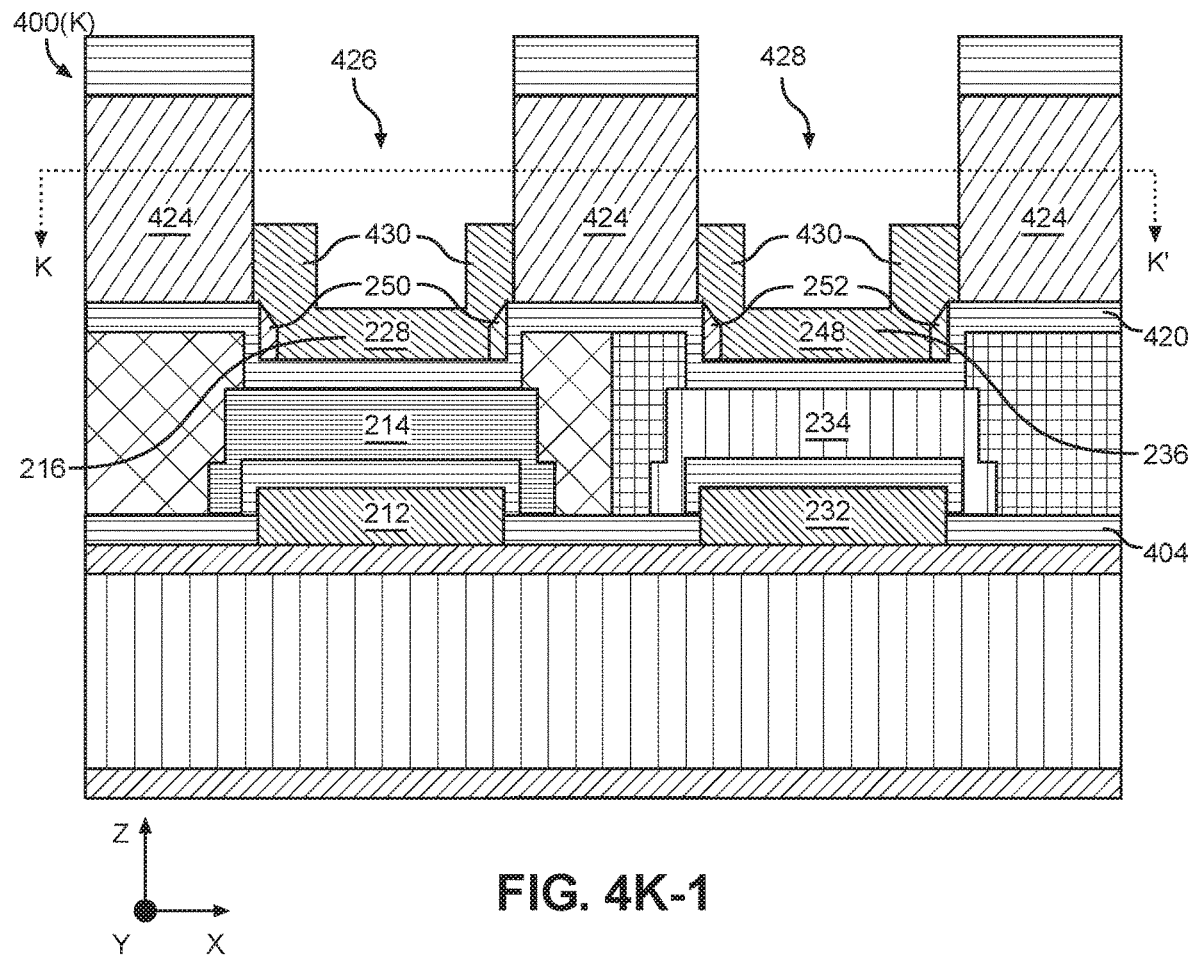
Figures 2, 4K:
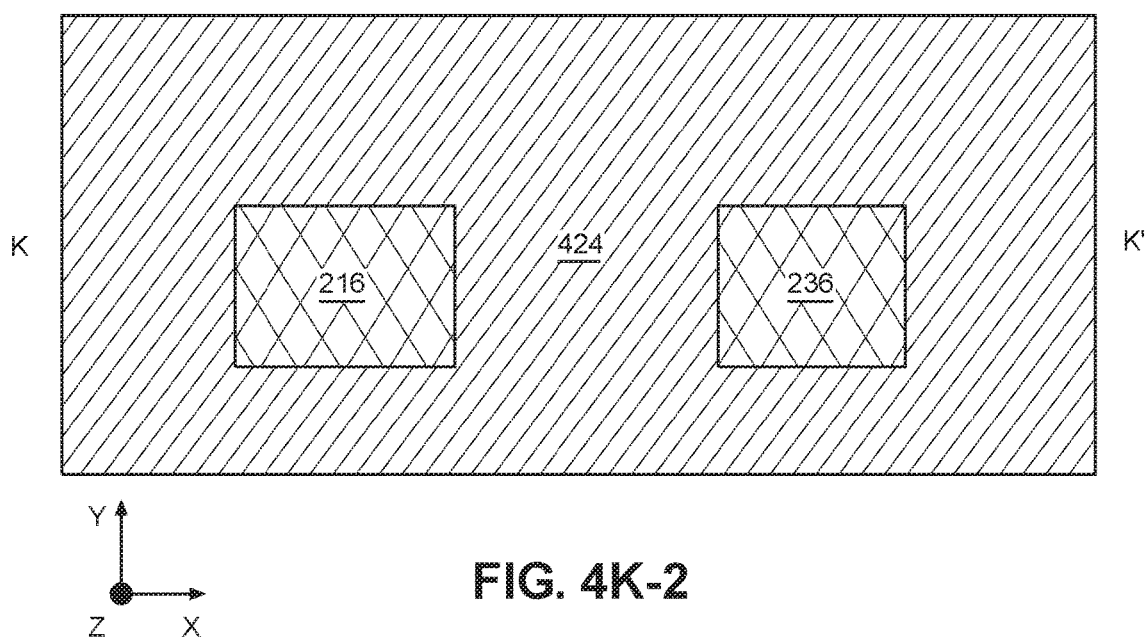

FIG. 4K-1 illustrates a cross-sectional side view in another exemplary fabrication stage 400(K) in which the top gate 216 and the top gate 236 are formed. The top gate 216 is formed over the N-type semiconductor structure 214 opposite (in the Z-axis direction) to the first bottom gate 212 (block 314), and the top gate 236 is formed over the P-type semiconductor structure 234 opposite (in the Z-axis direction) to the second bottom gate 232 (block 316). In this regard, a PR layer 424 is disposed and patterned to have an opening exposing a region 426 over the N-type semiconductor structure 214 and extending horizontally over both of the side spacers 250. The PR layer 424 also has an opening exposing a region 428 over the P-type semiconductor structure 234 and extending horizontally over both of the side spacers 252. The exposed region 426 includes areas in which the top gate 216 and the side spacers 250 are formed. The exposed region 428 includes areas in which the top gate 236 and the side spacers 252 are formed. The top gates 216 and 236 are formed by, for example, a process of depositing a gate material 430, such as evaporated metal (e.g., Ti/Au/Ti). The top gates 216 and 236 may be formed by other materials and other processes. The gate material 430 is deposited on the gate dielectric 220 and also on the side spacers 250, which causes the gate material 430 at the respective end portions 223NA and 223NB of the N-type semiconductor structure 214 to extend higher (in the Z-axis direction) than over the channel region 228 between the side spacers 250. In this manner, the top gate 216 resembles a cup shape in which the top gate electrode 254 may be formed. Similarly, the gate material 430 is deposited on the gate dielectric 240 and also on the side spacers 252, which causes the gate material 430 at the respective end portions 223PA and 223PB of the P-type semiconductor structure 234 to extend higher (in the Z-axis direction) than over a center of the channel region 248 between the side spacers 252. In this manner, a top surface of the top gate 236 resembles a cupped shape in which the top gate electrode 256 may be formed. FIG. 4K-2 illustrates a top view of the structure in FIG. 4K-1 taken at cross-section K-K' of the PR layer 424 employed for integrated formation of the top gates 216 and 236. The top gates 216 and 236 are second gates of the double gate structure for controlling current in the respective double gate FETs 201N and 201P. The top gates 216 and 236 in combination with the bottom gates 212 and 232, respectively, induce effective channel areas in the NFET 201N and the PFET 201P that are at least approximately twice as large as channel areas induced by either the top gates 216 and 236 or the bottom gates 212 and 232 alone.

Figures 1, 4L:
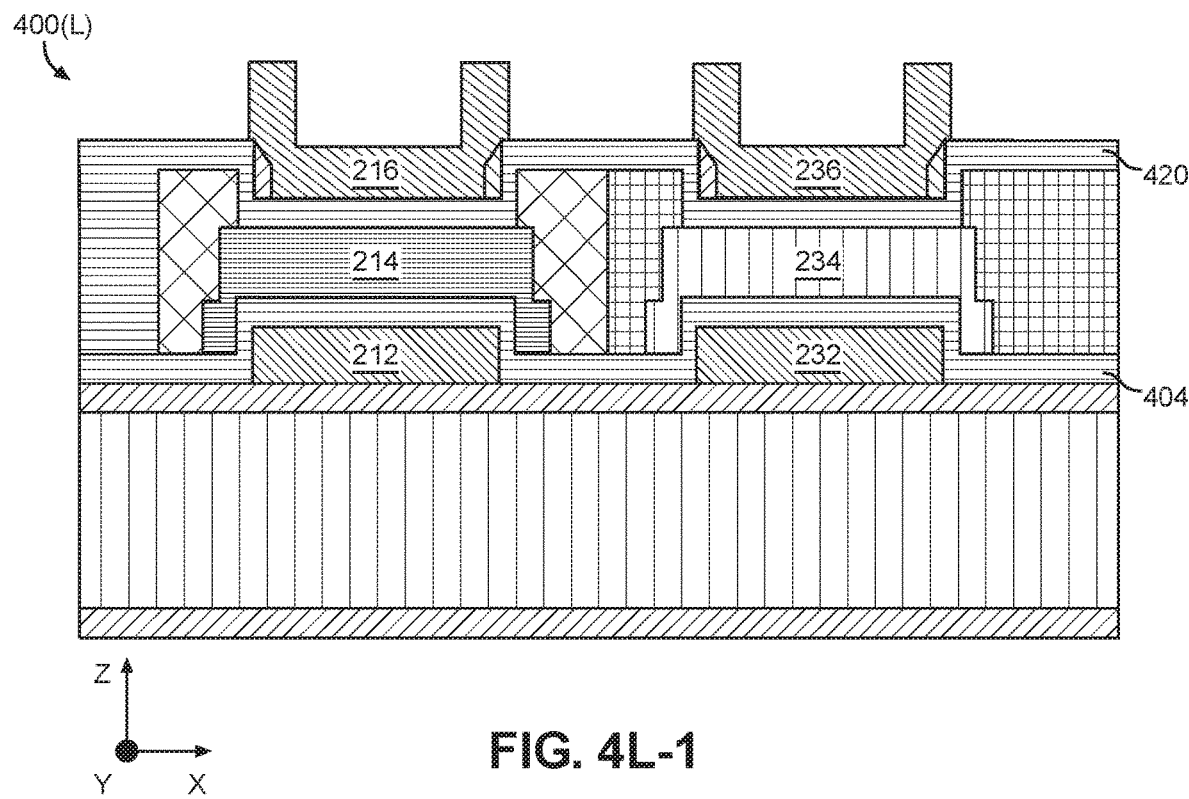
Figures 2, 4L:
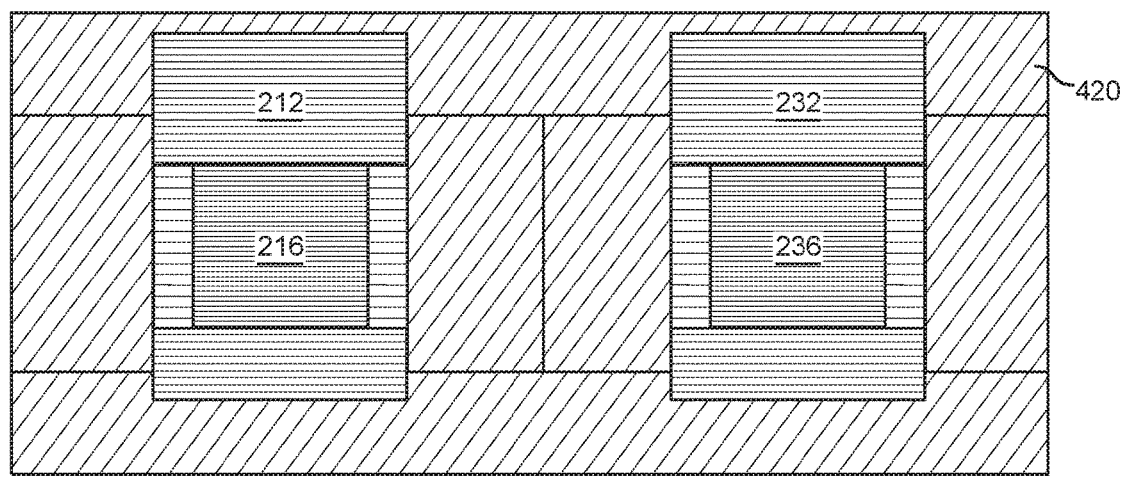

FIG. 4L-1 illustrates a first cross-sectional side view in another exemplary fabrication stage 400(L) in which the PR layer 424 is lifted from the structure in FIGS. 4K-1 and 4K-2. FIG. 4L-2 is a top view in the fabrication stage 400(L) showing that the oxide layer 420, and the oxide layer 404 underneath the oxide layer 420, are etched to expose the bottom gates 212 and 232.

Figure 4M:
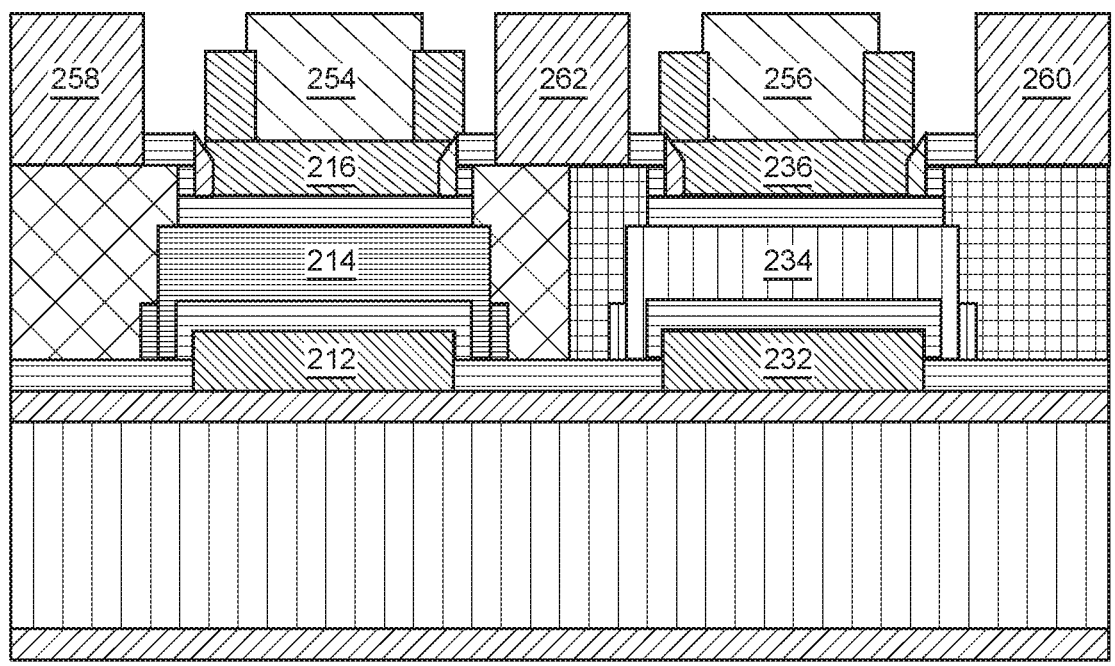

FIG. 4M illustrates a cross-sectional side view in another exemplary fabrication stage 400(M) in which a process is employed to etch the oxide layer 420 to expose metal contacts 226A, 226B, 246A, and 246B. The electrodes 258, 262, and 260 are disposed on the exposed portions of the metal contacts 226A, 226B and 246A, and 246B, respectively.

Figures 1, 5:
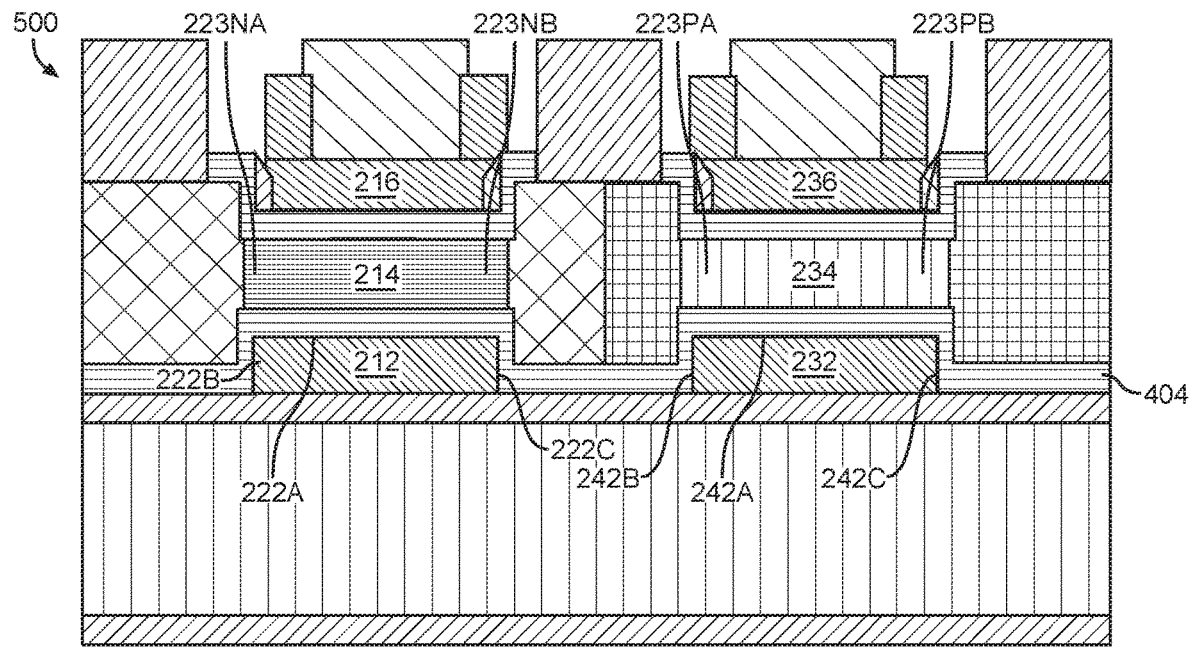
Figures 2, 5:
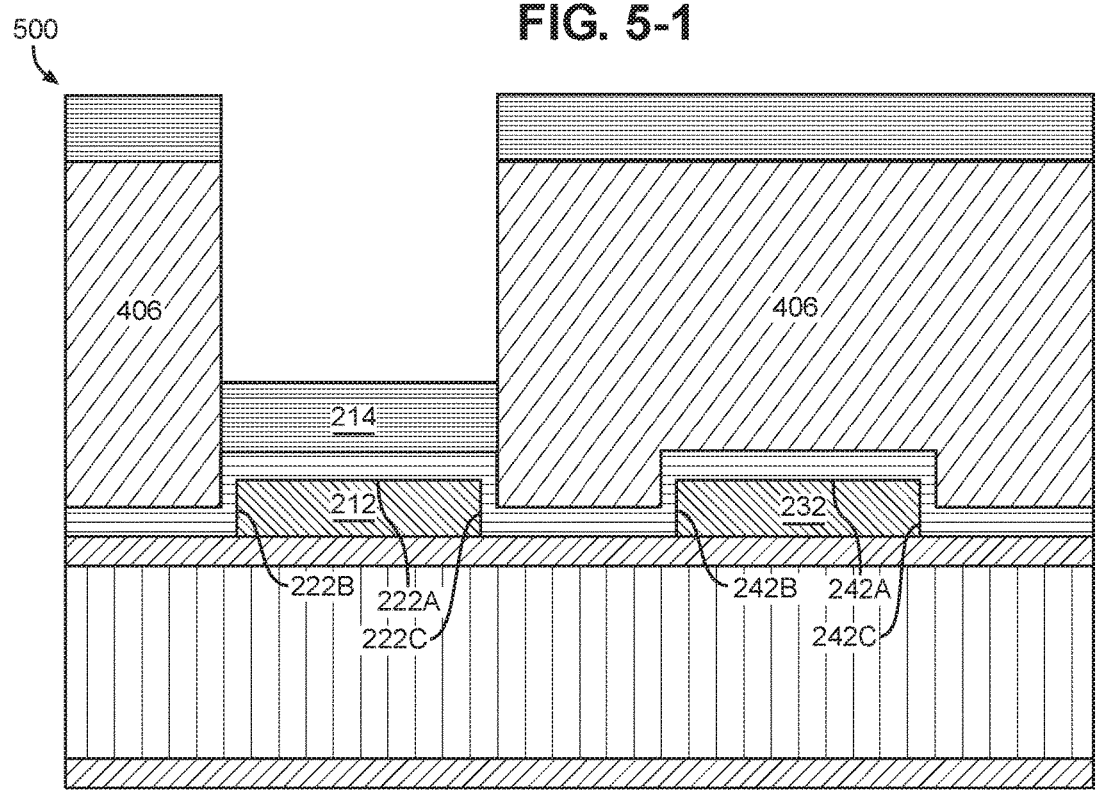
Figures 3, 5:
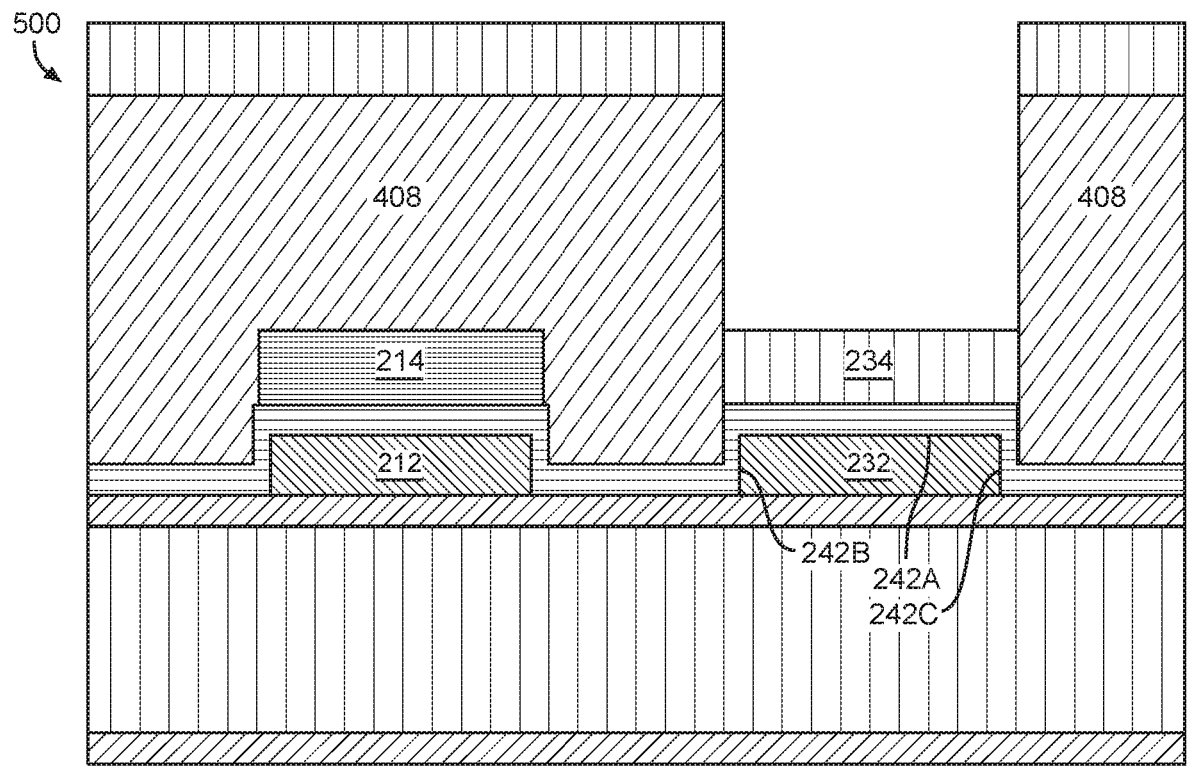
Figures 4, 5:
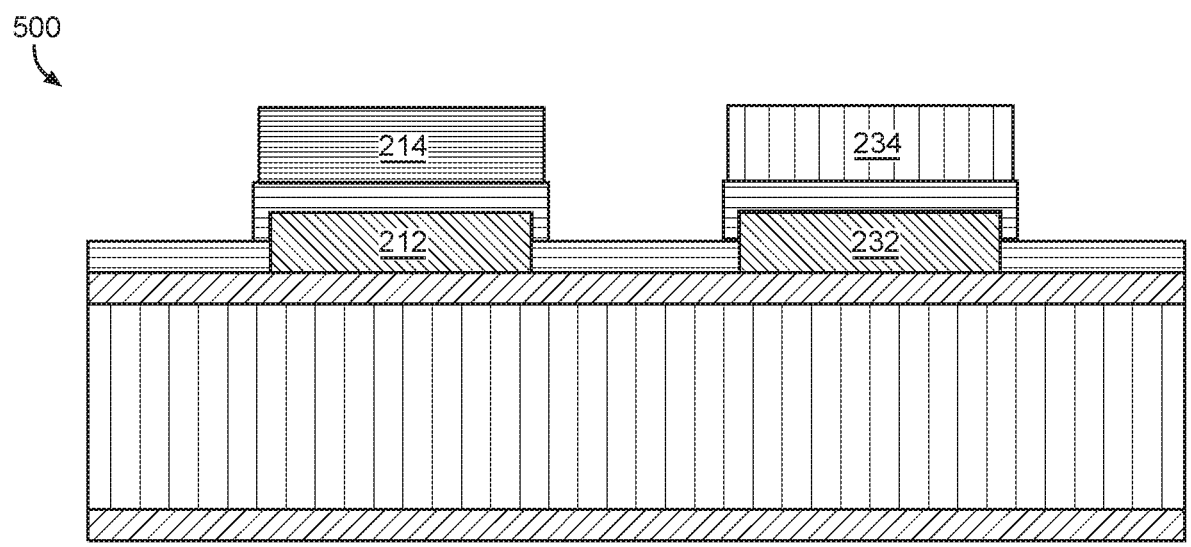

FIG. 5-1 illustrates a cross-sectional view corresponding to another exemplary fabrication stage in another exemplary CMOS circuit 500, which corresponds to the CMOS circuit 200 of FIGS. 2A and 2B. The CMOS circuit 500 differs from the CMOS circuit 200 only where the N-type semiconductor structure 214 and the P-type semiconductor structure 234 are formed differently than in fabrication stages 400(D) and 400(E) above. FIGS. 5-2, 5-3, and 5-4 illustrate cross-sectional side views of the CMOS circuit 500 in FIG. 5-1 at fabrication stages corresponding to FIGS. 4D-1, 4E-1, and 4F-1, respectively. As shown, the CMOS circuit 500 in FIGS. 5-2 to 5-4 is achieved by adjusting the openings in the PR layers 406 and 408 to expose only the top surfaces 222A and 242A for deposition of the NMOS channel material and PMOS channel material. Consequently, in the CMOS circuit 500, the P-type semiconductor structure 234 is formed over the oxide layer 404 disposed on the top surface 242A of the second bottom gate 232, but not on the side surfaces 242B and 242C. Similarly, the N-type semiconductor structure 214 is formed over the oxide layer 404 on the top surface 222A of the first bottom gate 212, but not on the side surfaces 222B and 222C. In this regard, the end portions 223NA and 223NB of the N-type semiconductor structure 214 and the end portions 223PA and 223PB of the P-type semiconductor structure 234 are end portions of areas above the top surfaces 222A and 242A, respectively. Otherwise, the fabrication stages for the CMOS circuit 500 are the same as the fabrication stages 400(A)-400(M) for fabricating the CMOS circuit 200.

The double gate, flexible TFT CMOS circuits according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 6:
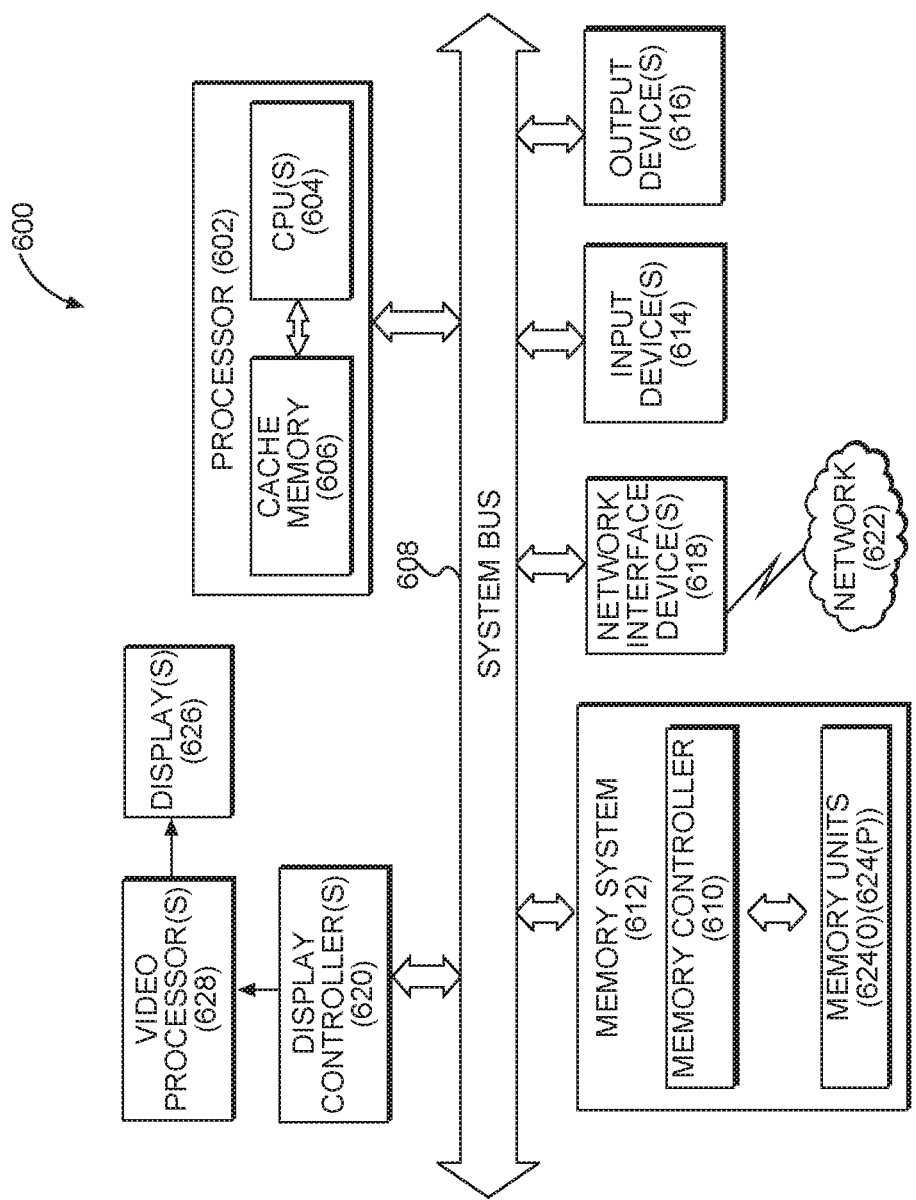
FIG. 6 is a block diagram of an exemplary processor-based system that can include the double gate flexible thin-film CMOS circuit of FIGS. 2A and 2B.

In this regard, FIG. 6 illustrates an example of a processor-based system 600 that can employ the double gate, thin film CMOS circuit 200 of FIGS. 2A and 2B. In this example, the processor-based system 600 includes one or more CPUs 602, each including one or more processors 604. The CPU(s) 602 may have cache memory 606 coupled to the processor(s) 604 for rapid access to temporarily stored data. The CPU(s) 602 is coupled to a system bus 608 and can intercouple master and slave devices included in the processor-based system 600. As is well known, the CPU(s) 602 communicates with these other devices by exchanging address, control, and data information over the system bus 608. For example, the CPU(s) 602 can communicate bus transaction requests to a memory controller 610 as an example of a slave device. Although not illustrated of FIG. 6, multiple system buses 608 could be provided, wherein each system bus 608 constitutes a different fabric.

Other master and slave devices can be connected to the system bus 608. As illustrated of FIG. 6, these devices can include a memory system 602, one or more input devices 614, one or more output devices 616, one or more network interface devices 618, and one or more display controllers 620, as examples. The input device(s) 614 can include any type of input device, including, but not limited to, input keys, switches, voice processors, etc. The output device(s) 616 can include any type of output device, including, but not limited to, audio, video, other visual indicators, etc. The network interface device(s) 618 can be any devices configured to allow exchange of data to and from a network 622. The network 622 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 618 can be configured to support any type of communications protocol desired. The memory system 612 can include one or more memory units 624(0)-624(P).

The CPU(s) 602 may also be configured to access the display controller(s) 620 over the system bus 608 to control information sent to one or more displays 626. The display controller(s) 620 sends information to the display(s) 626 to be displayed via one or more video processors 628, which process the information to be displayed into a format suitable for the display(s) 626. The display(s) 626 can include any type of display, including, but not limited to, a cathode ray tube (CRT), a liquid crystal display (LCD), a plasma display, a light emitting diode (LED) display, etc.

Figure 7:
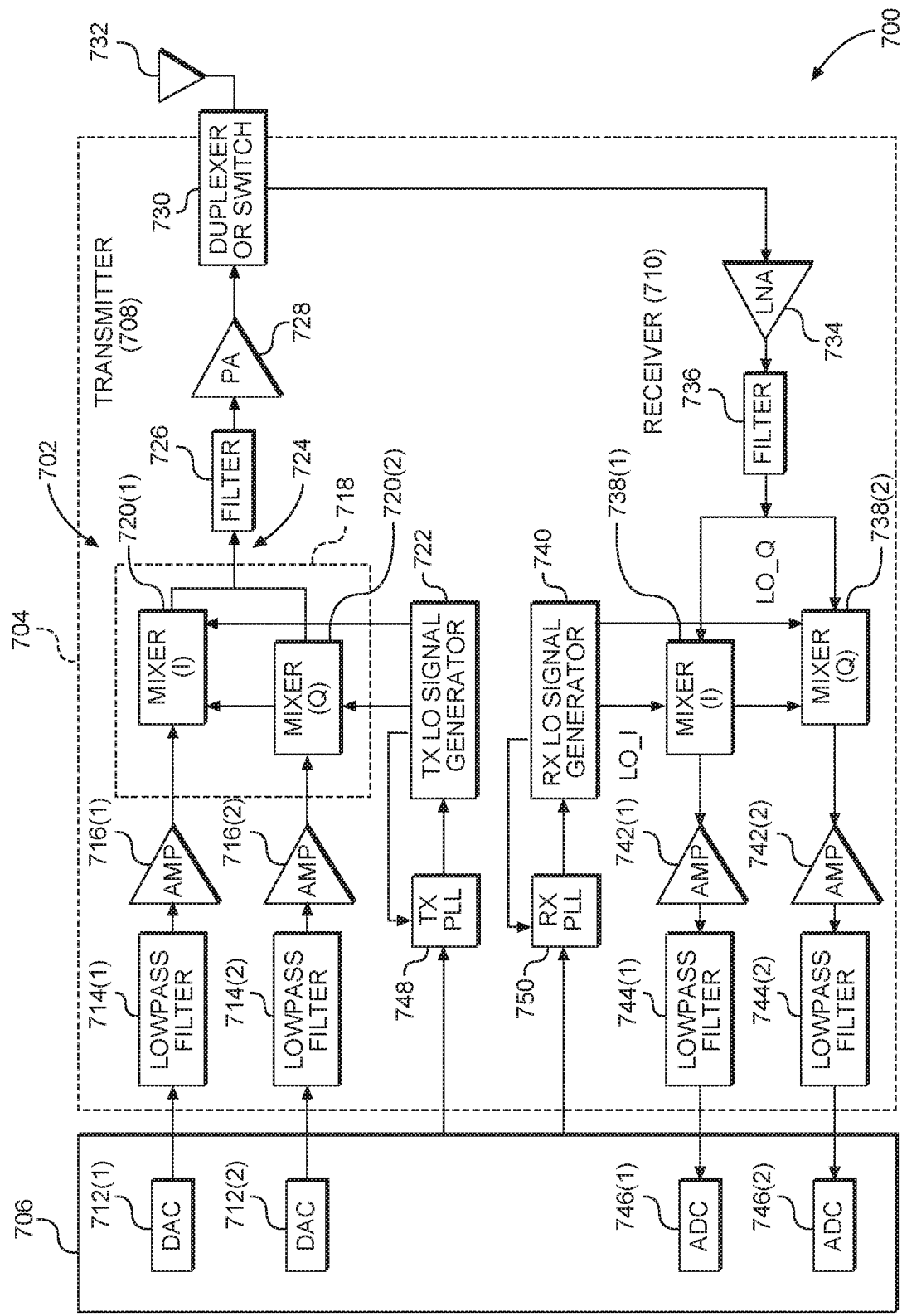
FIG. 7 is a block diagram of an exemplary wireless communications device that includes radio frequency (RF) components formed in an integrated circuit (IC), wherein clocked circuits in the wireless communications device can include the double gate flexible thin-film CMOS circuit of FIGS. 2A and 2B.

FIG. 7 illustrates an exemplary wireless communications device 700 that includes radio frequency (RF) components formed in an IC 702, wherein the IC 702 can include an IC employing a the double gate flexible thin-film CMOS circuit 200 of FIGS. 2A and 2B. In this regard, the wireless communications device 700 may be provided in the IC 702. The wireless communications device 700 may include or be provided in any of the above-referenced devices, as examples. As shown in FIG. 7, the wireless communications device 700 includes a transceiver 704 and a data processor 706. The data processor 706 may include a memory (not shown) to store data and program codes. The transceiver 704 includes a transmitter 708 and a receiver 710 that support bi-directional communications. In general, the wireless communications device 700 may include any number of transmitters 708 and/or receivers 710 for any number of communication systems and frequency bands. All or a portion of the transceiver 704 may be implemented on one or more analog ICs, RF ICs (RFICs), mixed-signal ICs, etc.

The transmitter 708 or the receiver 710 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 710. In the direct-conversion architecture, a signal is frequency-converted between RF and baseband in one stage. The super-heterodyne and direct-conversion architectures may use different circuit blocks and/or have different requirements. In the wireless communications device 700 of FIG. 7, the transmitter 708 and the receiver 710 are implemented with the direct-conversion architecture.

In the transmit path, the data processor 706 processes data to be transmitted and provides I and Q analog output signals to the transmitter 708. In the exemplary wireless communications device 700, the data processor 706 includes digital-to-analog converters (DACs) 712(1), 712(2) for converting digital signals generated by the data processor 706 into the I and Q analog output signals, e.g., I and Q output currents, for further processing.

Within the transmitter 708, low pass filters 714(1), 714(2) filter the I and Q analog output signals, respectively, to remove undesired signals caused by the prior digital-to-analog conversion. Amplifiers (AMPs) 716(1), 716(2) amplify the signals from the lowpass filters 714(1), 714(2), respectively, and provide I and Q baseband signals. An upconverter 718 upconverts the I and Q baseband signals with I and Q transmit (TX) local oscillator (LO) signals through mixers 720(1), 720(2) from a TX LO signal generator 722 to provide an upconverted signal 724. A filter 726 filters the upconverted signal 724 to remove undesired signals caused by the frequency upconversion as well as noise in a receive frequency band. A power amplifier (PA) 728 amplifies the upconverted signal 724 from the filter 726 to obtain the desired delivered power level and provides a transmitted RF signal. The transmitted RF signal is routed through a duplexer or switch 730 and transmitted via an antenna 732.

In the receive path, the antenna 732 receives signals transmitted by base stations and provides a received RF signal, which is routed through the duplexer or switch 730 and provided to a low noise amplifier (LNA) 734. The duplexer or switch 730 is designed to operate with a specific receive (RX)-to-TX duplexer frequency separation, such that RX signals are isolated from TX signals. The received RF signal is amplified by the LNA 734 and filtered by a filter 736 to obtain a desired RF input signal. Downconversion mixers 738(1), 738(2) mix the output of the filter 736 with I and Q RX LO signals (i.e., LO_I and LO_Q) from an RX LO signal generator 740 to generate I and Q baseband signals. The I and Q baseband signals are amplified by amplifiers (AMPs) 742(1), 742(2) and further filtered by lowpass filters 744(1), 744(2) to obtain I and Q analog input signals, which are provided to the data processor 706. In this example, the data processor 706 includes analog-to-digital converters (ADCs) 746(1), 746(2) for converting the analog input signals into digital signals to be further processed by the data processor 706.

In the wireless communications device 700 of FIG. 7, the TX LO signal generator 722 generates the I and Q TX LO signals used for frequency upconversion, while the RX LO signal generator 740 generates the I and Q RX LO signals used for frequency downconversion. Each LO signal is a periodic signal with a particular fundamental frequency. A TX phase-locked-loop (PLL) circuit 748 receives timing information from the data processor 706 and generates a control signal used to adjust the frequency and/or phase of the TX LO signals from the TX LO signal generator 722. Similarly, an RX PLL circuit 750 receives timing information from the data processor 706 and generates a control signal used to adjust the frequency and/or phase of the RX LO signals from the RX LO signal generator 740.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. A complementary metal-oxide semiconductor (CMOS) circuit, comprising:
   a flexible substrate;
   at least one P-type Field-Effect Transistor (FET) (PFET) formed on a first surface of the flexible substrate, each of the at least one PFET comprising:
      a first gate disposed on the first surface of the flexible substrate;
      a P-type thin-film semiconductor structure disposed over the first gate in a first axis direction, the P-type thin-film semiconductor structure comprising a first source/drain region, a second source/drain region, and a first channel region between the first and second source/drain regions; and
      a second gate disposed over the P-type thin-film semiconductor structure in the first axis direction opposite to the first gate;

at least one N-type FET (NFET) formed on the first surface of the flexible substrate, each of the at least one NFET comprising:
  a third gate disposed on the first surface of the flexible substrate;
  an N-type thin-film semiconductor structure disposed over the third gate in the first axis direction, the N-type thin-film semiconductor structure comprising a third source/drain region, a fourth source/drain region, and a second channel region between the third and fourth source/drain regions; and
  a fourth gate disposed over the N-type thin-film semiconductor structure in the first axis direction opposite to the third gate; and
at least one metal contact electrically coupling the second source/drain region of the at least one PFET and the third source/drain region of the at least one NFET.

2. The CMOS circuit of claim 1, wherein:
a PFET of the at least one PFET further comprises:
  a first metal contact disposed on the first source/drain region; and
  a second metal contact disposed on the second source/drain region; and
an NFET of the at least one NFET further comprises:
  a third metal contact disposed on the third source/drain region; and
  a fourth metal contact disposed on the fourth source/drain region;
wherein the at least one metal contact coupling the second source/drain region and the third source/drain region comprises the second metal contact and the third metal contact.

3. The CMOS circuit of claim 2, wherein:
the PFET of the at least one PFET further comprises:
  a first dielectric layer extending between one of at least one side surface of the first metal contact and a first side surface of the second gate, between the P-type thin-film semiconductor structure and a bottom surface of the second gate, and between one of at least one side surface of the second metal contact and a second side surface of the second gate opposite to the first side surface of the second gate; and
the NFET of the at least one NFET further comprises:
  a second dielectric layer extending between one of at least one side surface of the third metal contact and a first side surface of the fourth gate, between the N-type thin-film semiconductor structure and a bottom surface of the fourth gate, and between one of at least one side surface of the fourth metal contact and a second side surface of the fourth gate opposite to the first side surface of the fourth gate.

4. The CMOS circuit of claim 1, wherein:
the first gate and the second gate are configured to induce inversion channel layers in a bottom surface and a top surface, respectively, of the first channel region; and
the third gate and the fourth gate are configured to induce inversion channel layers in a bottom surface and a top surface, respectively, of the second channel region.

5. The CMOS circuit of claim 1, further comprising:
a signal input coupled to the first gate and the third gate; and
a signal output coupled to the at least one metal contact.

6. The CMOS circuit of claim 1, wherein the flexible substrate has a flexibility to bend in a range of approximately 0 to 90 degrees.

7. The CMOS circuit of claim 1, wherein the second gate is directly coupled to the first gate, and the fourth gate is directly coupled to the third gate.

8. The CMOS circuit of claim 1, wherein:
the P-type thin-film semiconductor structure comprises $Ge_2Sb_2Te_5$ (Germanium Antimony Tellurium) (GST); and
the N-type thin-film semiconductor structure comprises $InGaZnO_4$ (Indium Gallium Zinc Oxide) (IGZO).

9. The CMOS circuit of claim 1, integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

10. A method of fabricating a complementary metal-oxide semiconductor (CMOS) circuit on a flexible substrate, comprising:
  forming a first gate and a second gate on a surface of the flexible substrate;
  forming a P-type semiconductor structure over the first gate in a first axis direction;
  forming an N-type semiconductor structure over the second gate in the first axis direction;
  forming first and second P-type Field-Effect Transistor (FET) (PFET) source/drain regions in first and second end portions, respectively, of the P-type semiconductor structure;
  forming third and fourth N-type FET (NFET) source/drain regions in first and second end portions, respectively, of the N-type semiconductor structure;
  forming a first metal contact on the second PFET source/drain region and a second metal contact on the third NFET source/drain region, electrically coupling the second PFET source/drain region and the third NFET source/drain region through the first metal contact and the second metal contact;
  forming a third gate over the P-type semiconductor structure opposite to the first gate in the first axis direction; and
  forming a fourth gate over the N-type semiconductor structure opposite to the second gate in the first axis direction.

11. The method of claim 10, further comprising:
  forming a third metal contact on the first PFET source/drain region; and
  forming a fourth metal contact on the fourth NFET source/drain region.

12. The method of claim 11, further comprising:
  forming a dielectric on the first, second, third, and fourth metal contacts, the P-type semiconductor structure, and the N-type semiconductor structure, the dielectric disposed between a side surface of the first metal contact and a first side surface of the third gate, between a side surface of the third metal contact and a second side surface of the third gate, between a side surface of the second metal contact and a first side surface of the fourth gate, and between a side surface of the fourth metal contact and a second side surface of the fourth gate.

13. The method of claim 10, wherein:

forming the P-type semiconductor structure over the first gate comprises forming the first and second end portions of the P-type semiconductor structure to be adjacent to first and second side surfaces, respectively, of the first gate, and forming the N-type semiconductor structure over the second gate comprises forming the first and second end portions of the N-type semiconductor structure to be adjacent to first and second side surfaces, respectively, of the fourth gate.

14. The method of claim 10, further comprising:

forming an electrode on top surfaces of the first and second metal contacts.

15. The method of claim 10, wherein:

the N-type semiconductor structure comprises $InGaZnO_4$ (Indium Gallium Zinc Oxide) (IGZO); and the P-type semiconductor structure comprises $Ge_2Sb_2Te_5$ (Germanium Antimony Tellurium) (GST).

\* \* \* \* \*